United States Patent
Kanda et al.

(10) Patent No.: US 7,583,123 B2
(45) Date of Patent: Sep. 1, 2009

(54) HIGH-SPEED FLIP-FLOP CIRCUIT

(75) Inventors: Kouichi Kanda, Kawasaki (JP); Satoshi Matsubara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/059,509

(22) Filed: Feb. 17, 2005

(65) Prior Publication Data

US 2005/0242861 A1  Nov. 3, 2005

(30) Foreign Application Priority Data

Apr. 30, 2004  (JP)  ............................. 2004-136784

(51) Int. Cl.
H03K 3/00  (2006.01)
(52) U.S. Cl. ...................... 327/218; 327/219
(58) Field of Classification Search ................. 327/200, 327/203, 206, 208, 210–212, 214–215, 218–219
See application file for complete search history.

(56) References Cited

U.S. PATENT DOCUMENTS

| | | | | |
|---|---|---|---|---|
| 5,898,330 A | * | 4/1999 | Klass | 327/210 |
| 5,933,038 A | * | 8/1999 | Klass | 327/208 |
| 6,150,859 A | * | 11/2000 | Park | 327/158 |
| 6,181,180 B1 | * | 1/2001 | Chen et al. | 327/211 |
| 6,646,487 B2 | * | 11/2003 | Nedovic et al. | 327/211 |
| 6,680,638 B2 | * | 1/2004 | Kim et al. | 327/218 |
| 6,972,605 B1 | * | 12/2005 | Choe | 327/200 |

| | | |
|---|---|---|
| 2001/0028269 A1 | 10/2001 | Shuler, Jr. |
| 2002/0130693 A1 | 9/2002 | Kojima et al. |
| 2004/0080351 A1 | 4/2004 | Hirata et al. |

FOREIGN PATENT DOCUMENTS

| | | |
|---|---|---|
| JP | 03-228296 | 10/1991 |
| JP | 04-159808 A | 6/1992 |
| JP | 04-290303 | 10/1992 |
| JP | 05-122024 A | 5/1993 |
| JP | 08-256044 A | 10/1996 |
| JP | 11-330924 A | 11/1999 |
| JP | 2002-026697 | 1/2002 |
| JP | 2002-026697 A | 1/2002 |
| JP | 2002-208841 | 7/2002 |

* cited by examiner

*Primary Examiner*—Lincoln Donovan
*Assistant Examiner*—Khareem E. Almo
(74) *Attorney, Agent, or Firm*—Arent Fox LLP

(57) ABSTRACT

A flip-flop circuit that captures an input signal in sync with a clock, has a first gate outputting a first signal corresponding with input signal; a second gate generating a second signal of a first predetermined level in response to a first level of clock and causing the second signal to be a level of first signal in response to a second level of clock; and a third gate outputting a third signal of second signal in response to the second level of clock. Further the flip-flop circuit has a first inversion feedback circuit between the third and second signal terminals, that is activated in response to the second level of clock and latches the third signal together with third gate; and level fixing circuit that fixes the first signal terminal at a second predetermined level with a time delay after the clock changes to the second level.

13 Claims, 18 Drawing Sheets

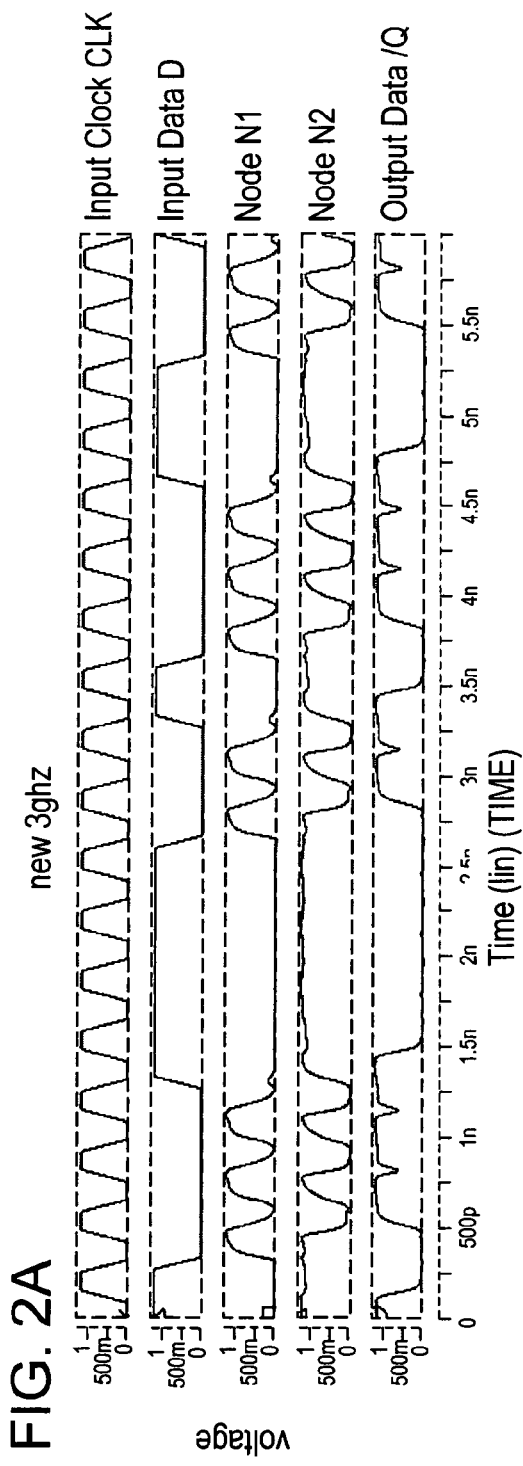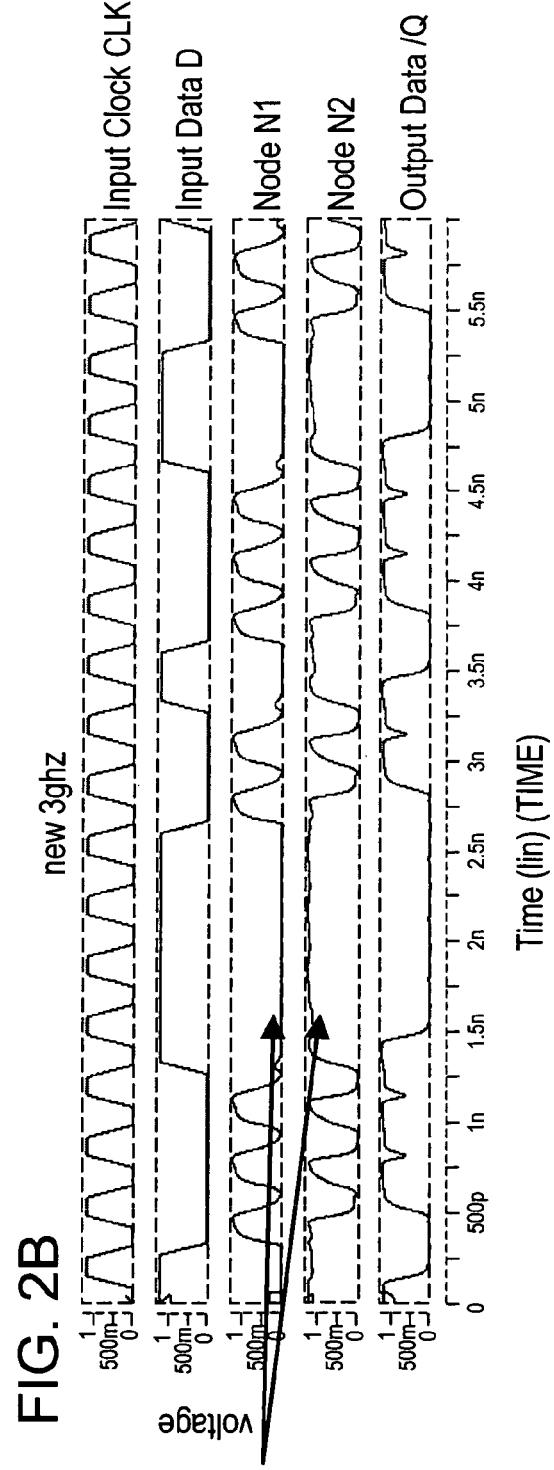

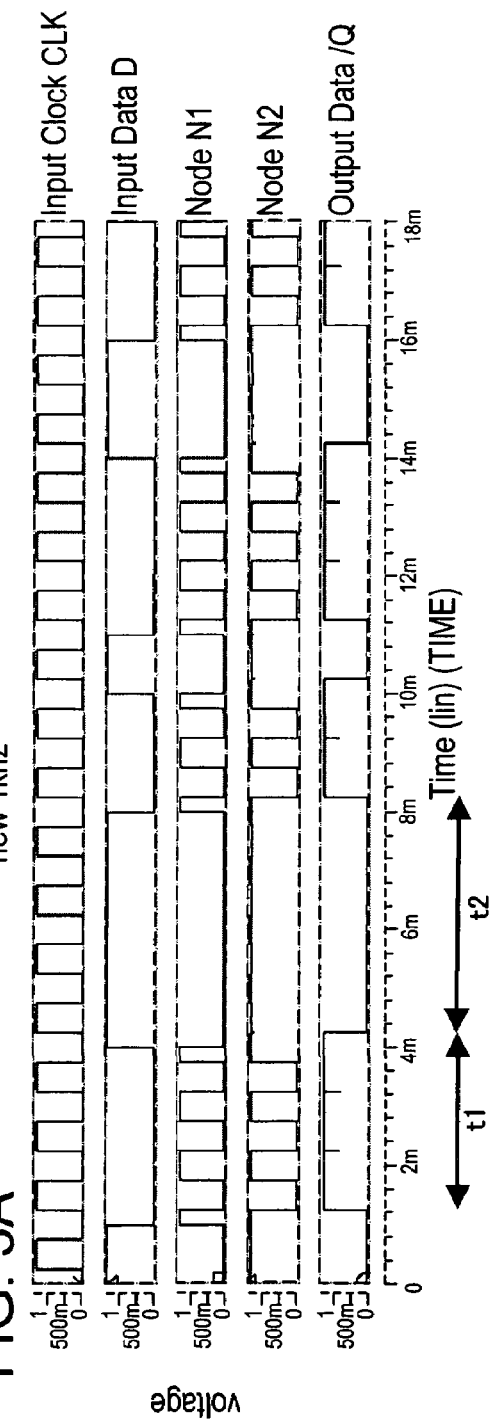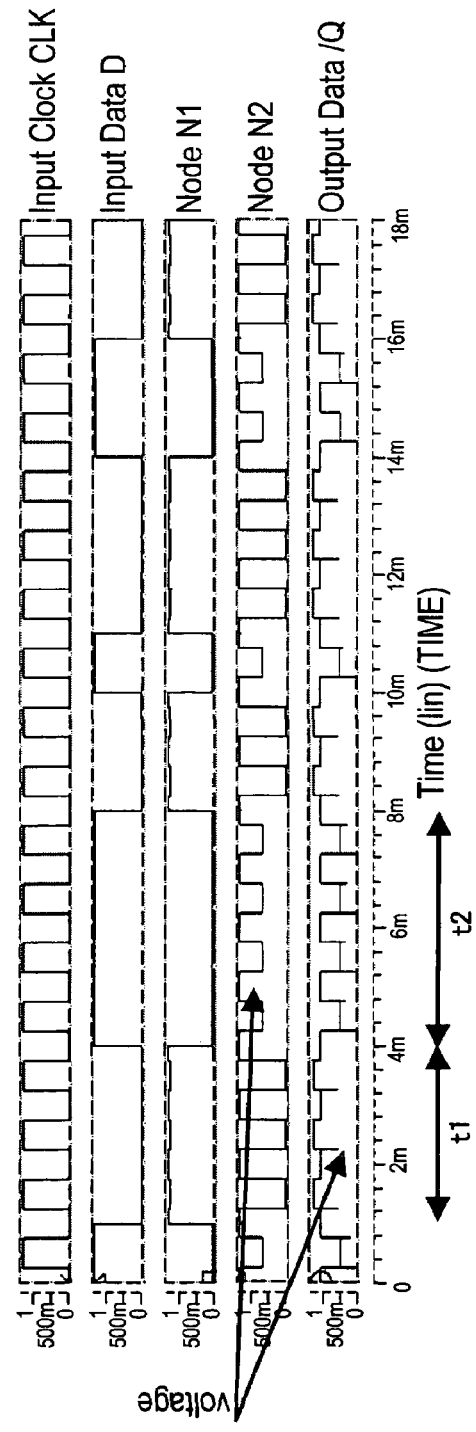

Theoretical Diagram

Embodiment 3

Embodiment 8

US 7,583,123 B2

HIGH-SPEED FLIP-FLOP CIRCUIT

CROSS-REFERENCE TO RELATED APPLICATIONS

This application is based upon and claims the benefit of priority from the prior Japanese Patent Application No. 2004-136784, filed on Apr. 30, 2004, the entire contents of which are incorporated herein by reference.

BACKGROUND OF THE INVENTION

1. Field of the Invention

The present invention relates to a flip-flop circuit that operates at high-speed at a low voltage, and, more particularly, to a high-speed flip-flop circuit that makes it possible to avoid instability in a low speed clock operation.

2. Description of the Related Art

An LSI chip contains a large number of flip-flop circuits. Known flip-flops that operate at high-speed include dynamic-type flip-flop circuits that capture data in response to the clock. Conventional dynamic type flip-flop circuits have a CMOS transfer gate provided on the input side of the inverters and between the inverters, capture input data and performs data transfers to a subsequent stage by turning a CMOS transfer gate on and off under the control of the clock. A dynamic-type flip-flop circuit of this kind is mentioned in Japanese Patent Application Laid Open No. H3-228296 (published on Oct. 9, 1991) and Japanese Patent Application Laid Open No. 2002-208841 (published on Jul. 26, 2002), for example.

In keeping with the higher speeds of LSIs in recent years, signal transfers between chips and signal transfers between circuit blocks and elements in a chip have become faster and faster. Accordingly, flip-flop circuits, which are provided in great numbers in an LSI chip, are now also required to operate at higher speeds. In this case, a dynamic-type flip-flop circuit that uses the CMOS transfer gate above is unsuitable for high-speed operations on account of the delay time caused by the transfer gates.

On the other hand, dynamic-type flip-flop circuits that do not use transfer gates have also been proposed (Japanese Patent Application Laid Open No. 2002-26697 (published on Jan. 25, 2002), for example). In this flip-flop circuit, a clock-controlled PMOS transistor and NMOS transistor are inserted in the CMOS inverter to capture input data in sync with clocks.

The dynamic-type flip-flop circuit above has a total of four transistors, which are two transistors for clock control and two transistors that constitute the CMOS inverter, connected between ground and the power supply. Hence, the power supply voltage cannot be lowered and therefore a dynamic-type flip-flop circuit of this kind is not suited to low power consumption.

On the other hand, a flip-flop circuit that is capable of operating in correspondence with a high-speed clock is also required to operate stably with respect to a low speed clock. That is, even in cases where the control clock frequencies extend over a broad frequency band, such a flip-flop circuit is required to operate without malfunctioning.

SUMMARY OF THE INVENTION

It is therefore an object of the present invention to provide a high-speed dynamic-type flip-flop circuit that operates at high-speed with a low voltage and stably within a broad frequency band.

In order to achieve the above object, a first aspect of the present invention is a flip-flop circuit that captures an input signal in sync with a clock, comprising a first gate that outputs a first signal corresponding with the input signal; a second gate that generates a second signal of a first predetermined level in response to a first level of the clock and causes the second signal to be a level corresponding with the first signal in response to a second level of the clock; a third gate that outputs a third signal corresponding with the second signal in response to the second level of the clock; a first inversion feedback circuit, provided between the terminal of the third signal and the terminal of the second signal, that is activated in response to the second level of the clock and latches the third signal together with the third gate; and level fixing circuit that fixes the terminal of the first signal at a second predetermined level with a predetermined time delay after the clock changes to the second level.

In order to achieve the above object, a second aspect of the present invention is a flip-flop circuit including a first power supply and a second power supply of a potential that is different from that of the first power supply, for capturing an input signal in sync with a clock, comprising first, second and third gates comprising transistors connected in three stages between the first and second power supplies. The first gate outputs a first signal that corresponds with the input signal and the second gate generates a second signal of a first predetermined level in response to a first level (low level, for example) of the clock and causes the second signal to be a level corresponding with the first signal in response to a second level (high level, for example) of the clock. Further, the third gate outputs a third signal that corresponds with the second signal in response to the second level (high level, for example) of the clock. The flip-flop circuit further comprises an inversion feedback circuit provided between the third signal terminal and the second signal terminal that is activated in response to the second level (high level, for example) of the clock; and level fixing circuit that fixes the first signal terminal at a second predetermined level with a predetermined time delay after the clock changes to the second level (high level, for example).

According to the aspects of the present invention, when operation takes place by means of a low speed clock, the first and second signal terminals can be prevented from entering a floating state by means of an inversion feedback circuit and level fixing means. Therefore, fluctuations in the level of each terminal caused by a leak current during low speed operation and, therefore, malfunctions, can be prevented.

BRIEF DESCRIPTION OF THE DRAWINGS

FIG. 2 is a waveform diagram for a simulation of this embodiment;

FIG. 3 is a waveform diagram for a simulation of this embodiment;

DESCRIPTION OF THE PREFERRED EMBODIMENTS

Embodiments of the present invention will be described hereinafter with reference to the drawings. However, the technical scope of the present invention covers the items appearing in the claims and any equivalents thereof rather than being limited to or by these embodiments.

Figure 1:
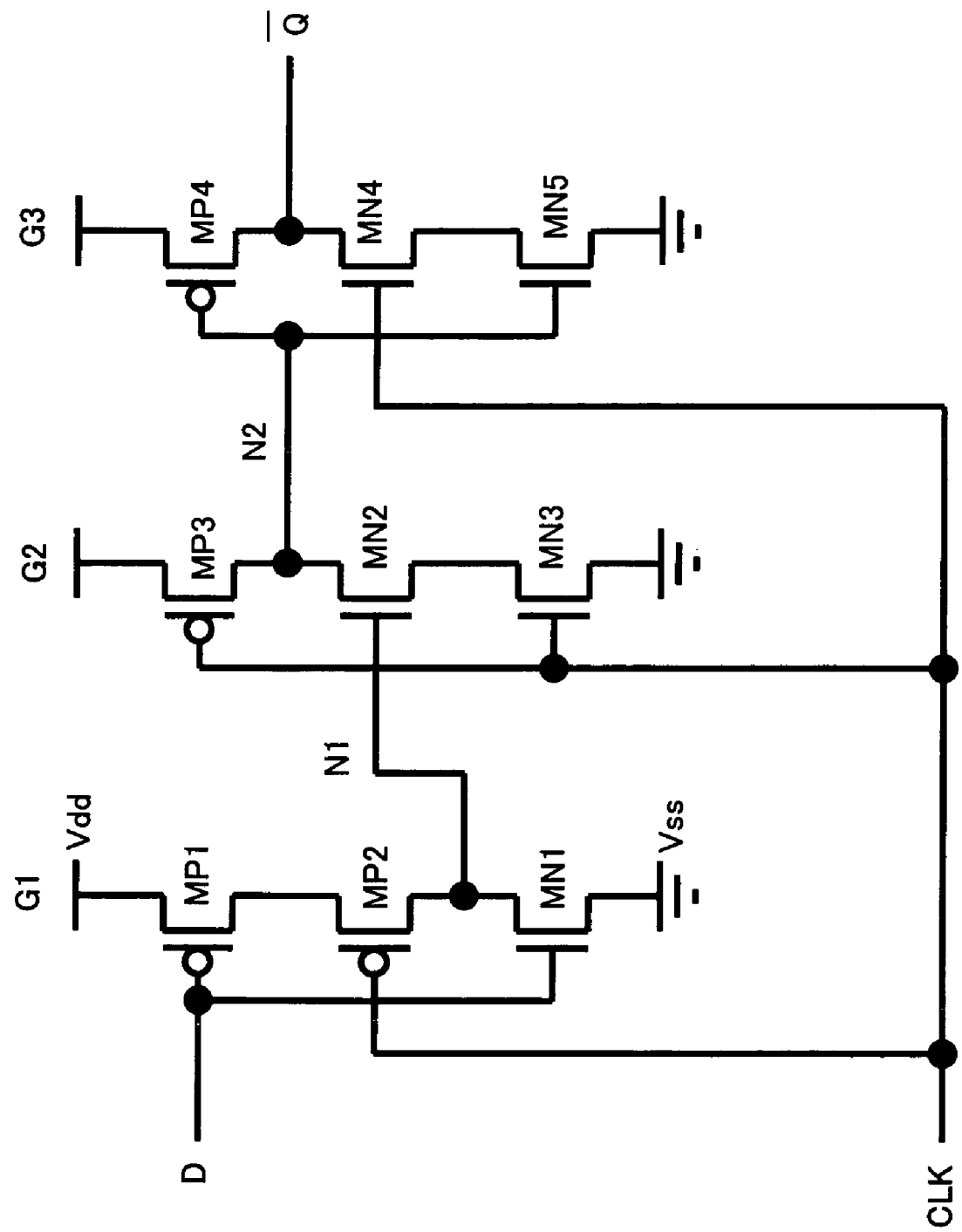
FIG. 1 is a circuit diagram showing an example of a dynamic-type flip-flop circuit.

FIG. 1 is a circuit diagram showing an example of a dynamic-type flip-flop circuit. This circuit is a TSPC-FF (True-Single-Phase Clocking Flip Flop) constituted by a three-stage gate in which three transistors are vertically connected between a ground power supply Vss and a high-potential power supply Vdd. In FIG. 1, the reference numeral MP has been assigned to P-channel transistors and the reference numeral MN has been assigned to N-channel transistors.

An initial-stage gate circuit G1 has, in three stages connected between the power supplies Vdd and Vss, the transistors MP1 and MN1, to which an input data signal D is inputted, and a transistor MP2, which is controlled by means of a clock CLK. Further, in the initial-stage gate circuit G1, while the clock CLK is at a low level, the transistor MP2 conducts, whereby the level according to the input data signal D is outputted to the output node N1. For example, if the input data signal D is at the low level, the transistor MP1 conducts and MN1 does not conduct, and the output node N1 is at the high level. If the input data signal D is at the high level, the transistor MN1 conducts, MP1 does not conduct, and the output node N1 assumes the low level.

Meanwhile, a second-stage gate circuit G2 comprises transistors MP3 and MN3, which are controlled by means of the clock CLK, and a transistor MN2, which is controlled by means of the output node N1 of the initial gate G1. Further, while the clock CLK is at the low level, transistor MP3 conducts and MN3 does not conduct, and the output node N2 is pre-charged to the high level. Further, when the clock CLK assumes the high level, by way of response, the transistor MP3 does not conduct, MN3 conducts, the transistor MN2 either conducts or does not conduct depending on the level of the node N1, and the output node N2 either retains the high level or is driven to the low level.

In addition, a third-stage gate circuit G3 comprises a transistor MN4, which is controlled by means of the clock CLK, and transistors MP4 and MN5, which are controlled by means of the node N2. Further, while the clock CLK is at the low level, transistor MN4 is nonconductive, and the gate circuit G3 is not activated. When the clock CLK assumes the high level, by way of response, the transistor MN4 conducts and the CMOS inverter of the transistors MP4 and MN5 inverts the level of the node N2 and outputs an output signal /Q (inverted Q).

Because the three-stage gate circuits G1, G2, and G3 all possess an inversion function, the inverted signal of the input data signal D is outputted as the output signal /Q. Further, while the clock CLK is at the low level, the level of the input data signal D is only captured at the node N1 and is not outputted as the output signal /Q. When the clock CLK assumes the high level, by way of response, the input data signal D is sampled at the node N1, the level of the node N2 is defined in accordance with node N1, and the output data signal D is outputted as the output signal /Q. The three-stage gate circuits operate dynamically in sync with clocks, each only operating in the event of a clock change and retaining their state at all other times.

FIGS. 2 and 3 show simulation waveforms of this embodiment. FIG. 2 is a waveform diagram during a high-speed operation in which the clock frequency is set high (3 GHz in this example) and FIG. 3 is a waveform diagram during a low-speed operation in which the clock frequency is set low (1 KHz in this example) FIGS. 2B and 3B are waveform diagrams during a high-speed operation and low-speed operation respectively of the flip-flop circuit in FIG. 1.

As shown in the simulation waveform diagrams, during the high-speed operation in FIG. 2B, when the clock CLK is at the high level, the nodes N1 and N2 are in a floating state (the waveforms with the arrows in FIG. 2B) but the change in the level of these nodes due to a leak current is slight for a short time of clock with higher level during the high-speed operation, therefore the flip-flop operates normally. That is, the inversion level of the input data signal D is generated as the output signal /Q. On the other hand, during the low-speed operation of FIG. 3B, because the clock signal remains at the high level for a long time, the levels of the nodes N1 and N2 in a floating state vary greatly due to a leak current and the output data signal /Q is not the inversion level of the input data signal D. That is, in a static operation, a malfunction caused by fluctuations in the level of the node in a floating state arises. This aspect will be described hereinbelow.

In the flip-flop circuit in FIG. 1, when the clock CLK is at the low level, node N2 is pre-charged to the high level, therefore transistor MP4 is turned off, and transistor MN4 is also turned off as a result of the low level of the clock CLK, whereby the output terminal /Q enters the floating state. Generally, LSIs have increasingly small transistors as speeds increase and necessitate a lower power supply voltage Vdd due to the drop of the gate withstand voltage and hence also a lower threshold voltage. As a result, there is an increase in the leak current when the transistors are off. Hence, during a relatively long period of a low-level clock signal in a low-speed operation, the level of the output terminal /Q in the floating state fluctuates due to the leak currents of the transistors MP4 and MN4, and so forth. This is shown in period t1 in FIG. 3B in which, as indicated by the arrows, the output data /Q that should be at the high level fluctuates while the clock signal CLK is at the low level.

On the other hand, when the clock CLK is at the high level, by way of response, the dynamic operation is performed and the inversion signal of the input data signal D is outputted to the output terminal /Q. Thereupon, when the transistor MP3 is turned off in accordance with the high level of the clock CLK and the input data D is at the high level, the node N1 is at the low level and the transistor MN2 is also turned off. That is, the node N2 enters the floating state. For this reason, when the clock CLK retains the high level for a relatively long period with the high level input data signal D, the level of the node N2 fluctuates as a result of the off leak current of the transistors MP3 and MN2. In period t2 in FIG. 3B, the level of node N2 drops while the clock CLK is at the high level. As a result of this drop in the level of node N2, the leak current of the transistor MP4 increases, and the output terminal /Q is made to fluctuate to a higher level. That is, the inversion signal of high-level input data D is not outputted to the output terminal /Q.

Furthermore, when input data signal D is at the low level while clock CLK is at the high level, transistors MP2 and MN1 are both in the off state and node N1 also enters the floating state. Therefore, the level of node N1 in a floating state can also be expected to fluctuate due to the leak current. The fluctuation in the level of node N1 causes fluctuations in the leak current of transistor MN2 and then fluctuations in the level of node N2 and, as a consequence, can be expected to bring about fluctuations in the output signal /Q.

As detailed earlier, the scale on the time axis differs between FIGS. 2 and 3 by the multiple $3 \times 10^6$. In the case of a high-speed operation, the clock cycle is short, and, therefore, as shown in FIG. 2, the fluctuations in the level of nodes N1 and N2, and /Q are at levels that can be disregarded because such levels do not result in a malfunction. However, in the case of a low speed operation, the clock cycle is long and hence the fluctuations in the level of these nodes increase to a level that cannot be disregarded, causing malfunctions. Therefore, in order to establish a normal operation with respect to clocks over a broad frequency band, malfunctions must be avoided by preventing fluctuations in the level of floating nodes during low-speed operation.

Figure 4:
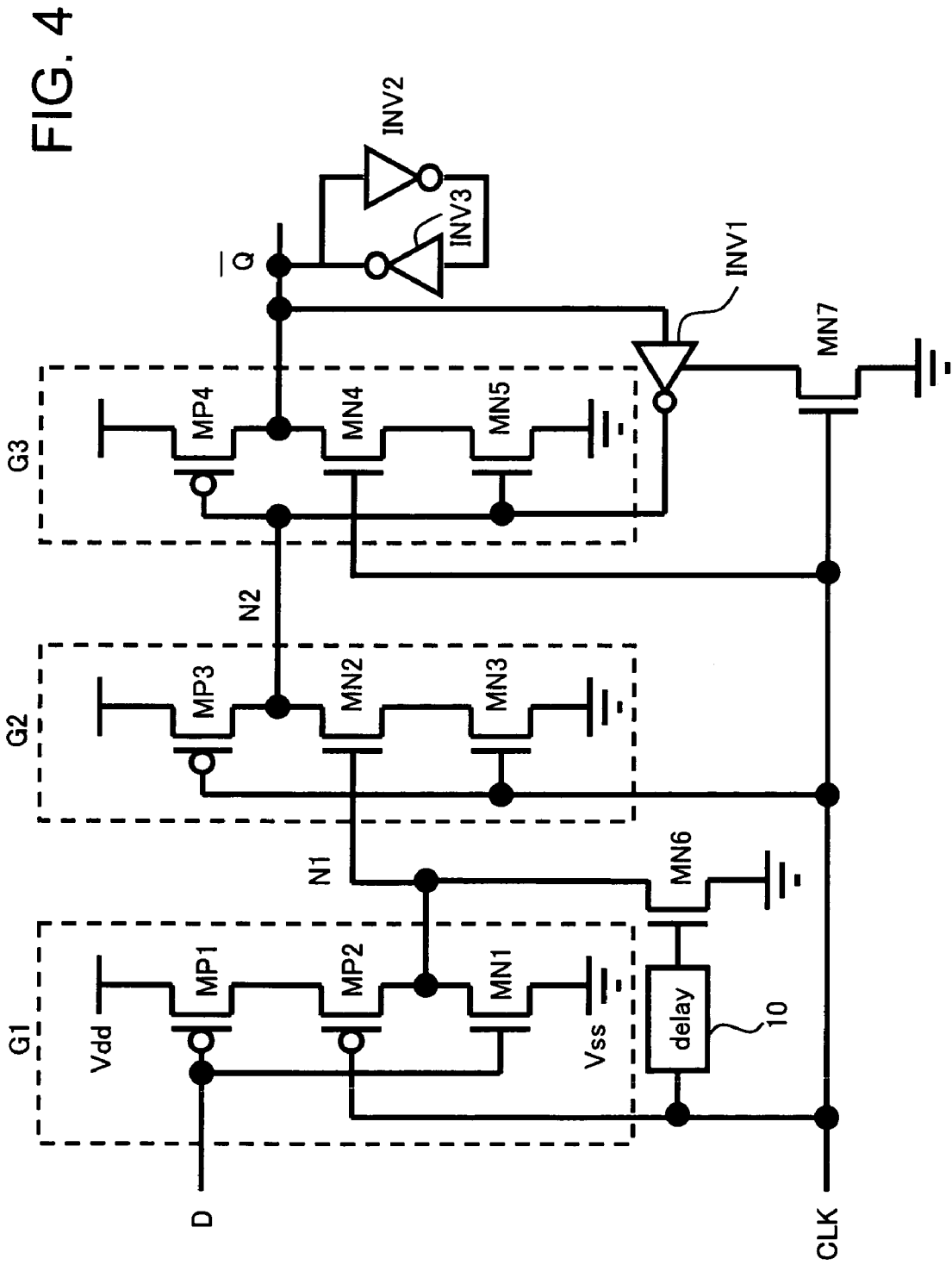
FIG. 4 is a theoretical diagram for the dynamic-type flip-flop circuit of this embodiment.

FIG. 4 is a theoretical diagram for the dynamic-type flip-flop circuit of this embodiment. Similarly to the flip-flop circuit in FIG. 1, this flip-flop circuit comprises three-stage gate circuits G1, G2, and G3 with a constitution in which three transistors are vertically connected between the power supplies Vdd and Vss. The constitution of these three-stage gate circuits and the dynamic operation through control of the clock CLK are the same as those in FIG. 1. These gate circuits have a constitution in which three transistors are vertically connected and, therefore, a reduction in the level of the power supply Vdd can be achieved. The clock CLK possesses a relatively broad frequency band from high frequencies to low frequencies. This flip-flop circuit operates suitably in correspondence with clocks CLK of a broad frequency band.

In the circuit of FIG. 4, the output terminal /Q and the nodes N1 and N2 are in the floating state and, in order to prevent a malfunction as a result of fluctuations in the level of these nodes due to a leak current, an inversion feedback circuit comprising an inverter INV1, which is activated when the clock CLK is at the high level, is first provided between the output terminal /Q and the node N2. That is, while the clock CLK is at the high level, the transistor MN7 is turned on and an operating current is supplied to the inverter INV1 for the activation. Secondly, a latch circuit comprising inverters INV2 and INV3 is connected to the output terminal /Q. Thirdly, a transistor MN6, which pulls the level of node N1 down to ground Vss after the clock CLK has changed to the high level and the level of the input data signal D has been transmitted to the output terminal /Q, is connected to node N1. That is, the high level of the clock CLK is supplied to transistor MN6 via a delay circuit 10, the level of node N1 is fixed at ground level a predetermined time after the clock CLK changes to the high level. In this example, level fixing circuit is constituted by the delay circuit 10 and transistor MN6.

Therefore, the operation of the flip-flop circuit in FIG. 4 will now be described. First, the dynamic operation by means of clock control will be described. The dynamic operation will be described while referencing the simulation waveform during the high-speed operation in FIG. 2A. It is assumed that the input data signal D is at the low level and clock CLK is at the low level. Transistors Mp1 and MP2 of the initial-stage gate circuit G1 are then both on, transistor MN1 is off and node N1 is at the high level (the level of power supply Vdd). Further, in the second-stage gate circuit G2, transistor MP3 is on, transistor MN3 is off and, therefore, node N2 is pre-charged to the high level. Accordingly, in the third stage gate circuit G3, transistor MP4 is off and transistor MN4 is off. However, the output terminal /Q is not in the floating state, being instead latched at a certain level by means of the latch circuit constituted by inverters INV2 and INV3.

Therefore, when clock CLK rises to the high level, by way of response, transistor MP2 of the initial-stage circuit G1 is turned off, and the low level of input data signal D is held as the high level at node N1. Further, in the second-stage gate circuit G2, in response to the rise of clock CLK, transistor MN3 is turned on and the pre-charged node N2 drops to the low level via transistors MN2 and MN3. Accordingly, in the third-stage gate circuit G3, transistor MP4 is turned on, output terminal /Q is pulled up to the high level, and the latch circuit INV2, INV3 is also inverted.

Thereafter, when the clock CLK drops to the low level, and, once again, a standby state is restored, node N1 assumes a level that corresponds with the input data signal D and node N2 assumes the pre-charge level.

A case where the input data signal D is at the high level will be described next. When the clock CLK is at the low level and input data signal D is at the high level, in the initial-stage gate circuit G1, transistor MP1 is turned off and MN1 is on, and node N1 is at the low level. The states of the second- and third-stage gate circuits G2 and G3 are the same as those described earlier. Therefore, when the clock CLK rises to the high level, in the initial-stage gate circuit G1, transistor MP2 is turned off and does not change to the low level of node N1. In the second-stage gate circuit G2, although transistor MN3 is turned on in response to the rise in the clock CLK, the node N1 is at the low level, therefore, transistor MN2 is off and does not change to the high level of the node N2. Further, in the third stage gate circuit G3, transistors MN4 and MN5 are turned on, the output terminal /Q assumes the low level and the latch circuit INV2, INV3 performs inversion.

As detailed above, the dynamic operation when the clock CLK has changed is the same as that for the case in FIG. 1.

Next, the malfunction-free static operation of the flip-flop circuit in FIG. 4 will be described with reference to FIGS. 2 and 3. In the high-speed operation in FIG. 2A, the clock cycle is short and level fluctuations caused by leak currents of floating nodes are small and, therefore, the output signal /Q normally outputs the inversion level of the input data D as per FIG. 2B. On the other hand, the low speed operation in FIG. 3A is as follows.

First, while the clock CLK is at the low level, transistor MP4 is off as a result of the node N2 being pre-charged to the high level and transistor MN4 is also off as a result of the low level of the clock CLK. However, because the latch circuit comprising inverters INV2 and INV3 is provided at the output terminal /Q, the output terminal /Q is not in a floating state and, hence, fluctuations in the level of the output terminal /Q as a result of a leak current of the off-state transistors MP4 and MN4 are avoided. Therefore, in period t1, the output signal /Q is held at the inversion level (high level) of the input data signal D. In comparison with FIG. 3B, it is clear that no malfunctions occur.

On the other hand, while the clock CLK is at the high level, transistor MP3 is off and, when the input data signal D is at the high level, node N1 is at the low level and transistor MN2 is also off. Therefore the node N2 could be a floating state. However, when the clock CLK is at the high level, inverter INV1 of the inversion feedback circuit is activated as a result of transistor MN7 being on, and node N2 is latched at the inversion level of the output signal /Q. That is, node N2 is fixed at the inversion level of the output signal /Q by means of the inversion feedback circuit INV1. That is, the gate G3 and the feedback inverter INV1 constitutes a latch circuit. Therefore, even when a leak current is produced at the node N2 when transistors MP3 and MN2 are off, node N2 is held at the high level by means of the inverter INV1 and is not in a floating state. Therefore, unlike the circuit in FIG. 1, there are no fluctuations in the level of node N2. Therefore, in period t2, the output terminal /Q is held at the inversion level of input data signal D. In comparison with FIG. 3B, it is clear that no malfunctions occur.

Further, because the inverter INV1 of the inversion feedback circuit is inactive while the clock is at the low level, the driving operation in which node N2 is driven to the pre-charge level is not affected. The driving operation of output terminal /Q by means of node N2 directly after the rise of the clock CLK to the high level is also unaffected.

In addition, when the input data signal D is at the low level, transistor MN1 is off and, when the clock CLK is at the high level, transistor MP2 is also off. Therefore, the node N11 could be floating state. However, the rise in the clock CLK to the high level is transmitted to transistor MN6 via the delay circuit 10 and, after the high level of node N1 has been transmitted to the output terminal /Q, transistor MN6 conducts and node N1 is fixed at the low level. The delay time of the delay circuit 10 is set as the time until the output terminal /Q is defined via node N2 in accordance with the level of node N1 after the clock CLK has assumed the high level. Therefore, transistor MN6, which constitutes the level fixing circuit, does not hinder the dynamic operation.

In the absence of the level fixing circuit, in a period when a clock CLK is at the high level, although there is the possibility that node N1 will enter the floating state and fluctuations in the level thereof will occur as a result of a leak current, which will produce fluctuations in the level of node N2, this possibility is suppressed by the level fixing circuit in this embodiment. Further, in comparison with transistor MN1, or the like, transistor MN6, which constitutes the level fixing circuit, has a small transistor area and the leak current of the transistor MN6 is infinitesimal.

As detailed earlier, as shown in FIG. 3A, the flip-flop circuit of this embodiment does not exhibit malfunctions of the output data /Q as indicated by the arrows in FIG. 3B even during low speed operation and, hence, the flip-flop circuit operates normally over a broad frequency band.

Figure 5:
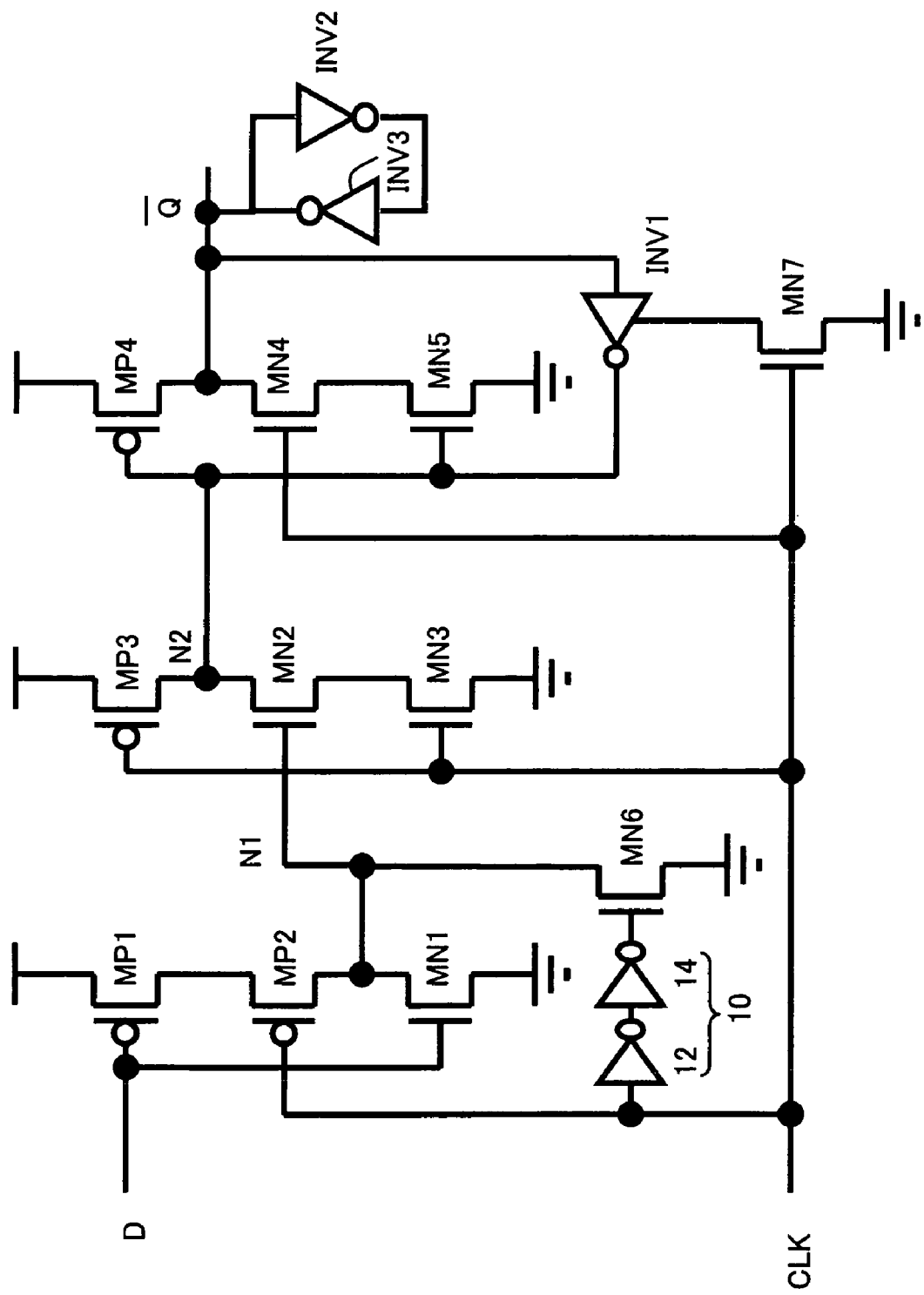
FIG. 5 is a circuit diagram for the dynamic-type flip-flop circuit (1) of this embodiment.

FIG. 5 is a circuit diagram for the dynamic-type flip-flop circuit (1) of this embodiment. As a point of difference from the theoretical diagram in FIG. 4, the level fixing circuit comprises the transistor MN6 and the delay circuit 10 including inverters 12 and 14 that transmit the clock CLK with a delay. Otherwise, the constitution is the same as that of FIG. 4. That is, the rise of clock CLK to the high level is delayed via the two-stage inverters 12 and 14 and turns on transistor MN6 at the time above. As a result, node N1 is fixed at the low level and fluctuations in the level at node N1 as a result of a leak current are prevented.

Figure 6:
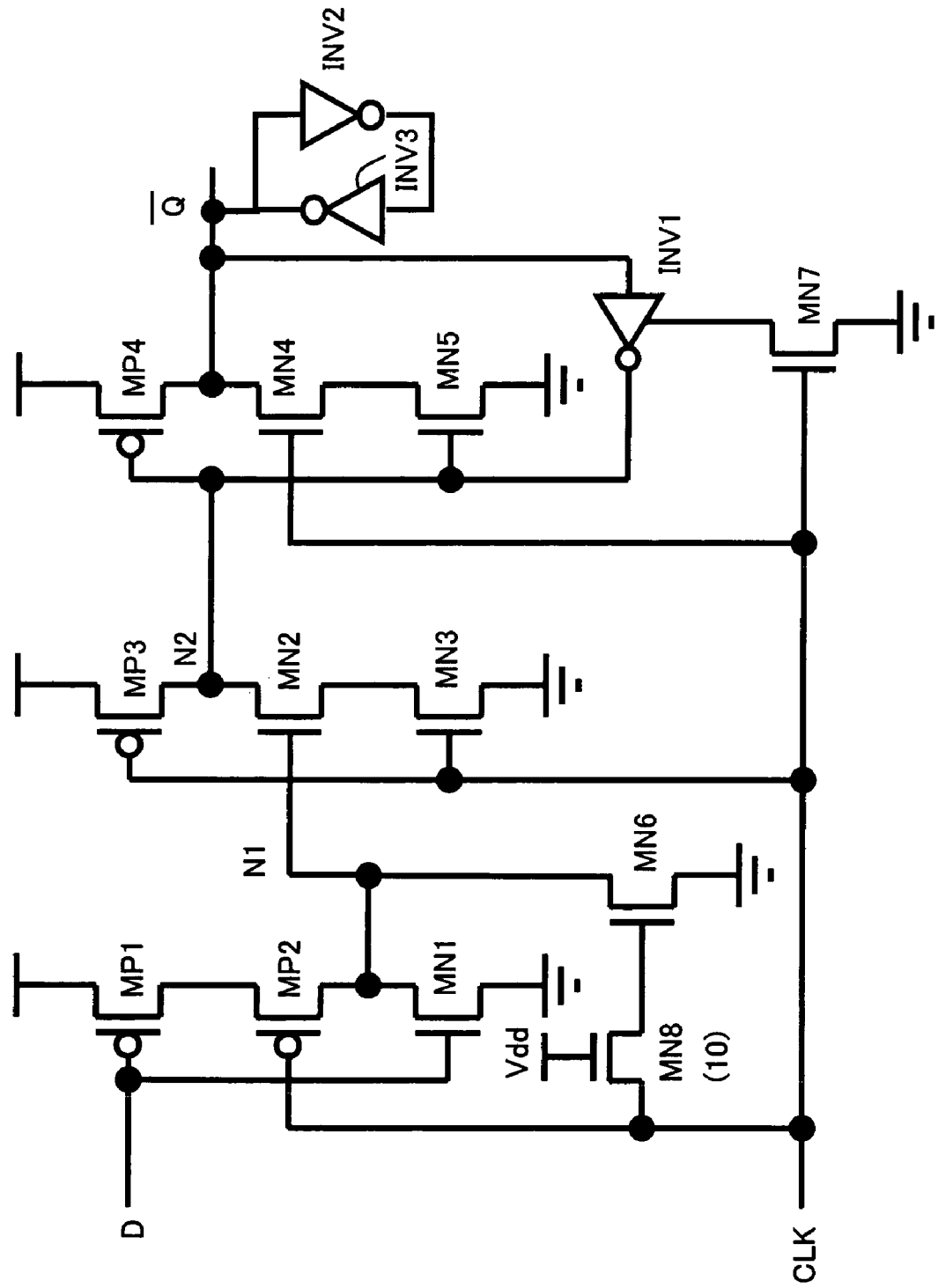
FIG. 6 is a circuit diagram for the dynamic-type flip-flop circuit (2) of this embodiment.

FIG. 6 is a circuit diagram for the dynamic-type flip-flop circuit (2) of this embodiment. As a point of difference from the theoretical diagram in FIG. 4, the level fixing circuit comprises the transistor MN6 and a transfer gate circuit including transistor MN8 that transmits the clock CLK with a delay. The gate of transistor MN8 is connected to the power supply Vdd. The ON resistance of transistor MN8 is set at a value that is small enough to provide a delay function. Otherwise, the constitution is the same as that of FIG. 4.

Figure 7:
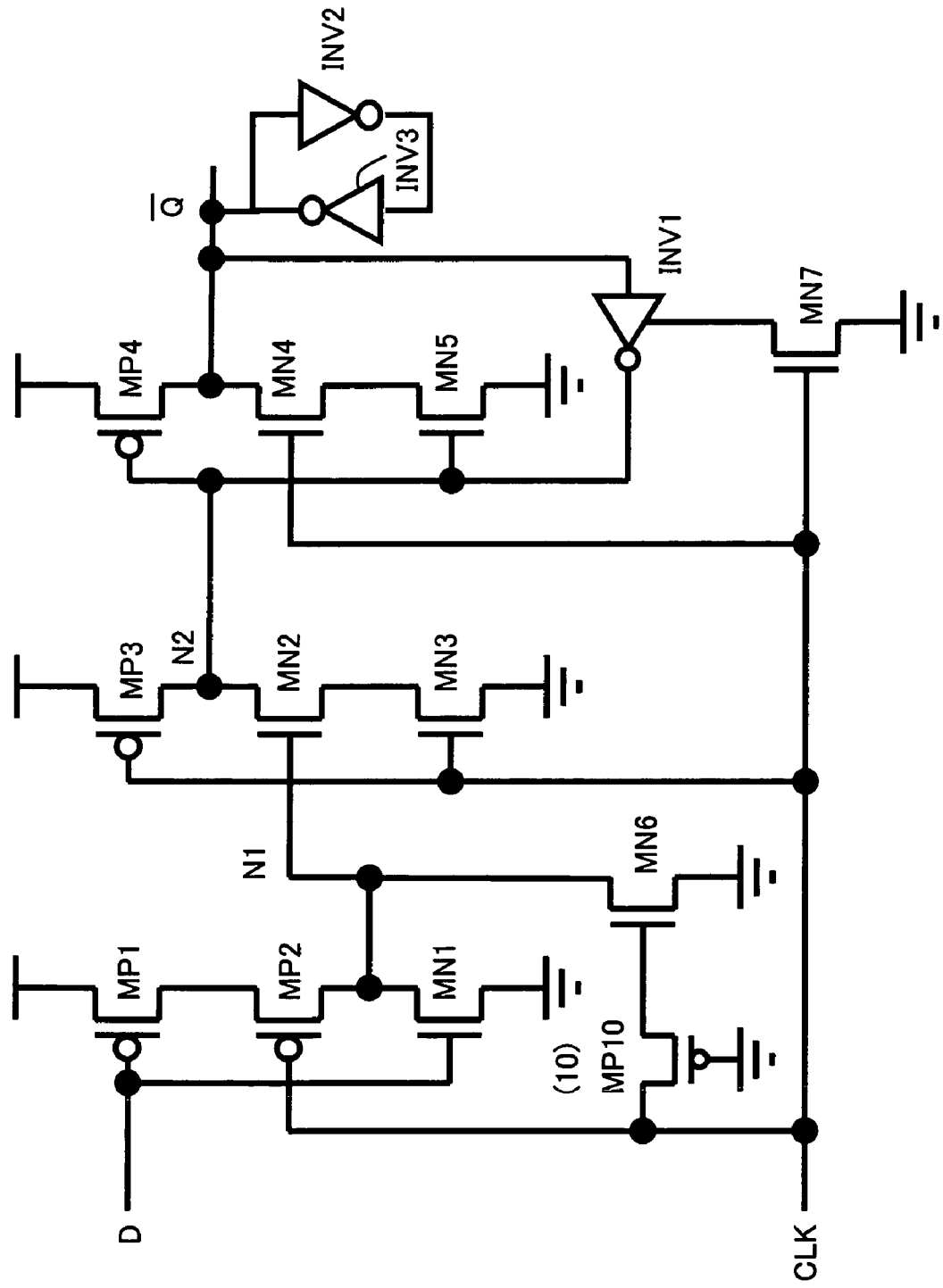
FIG. 7 is a circuit diagram for the dynamic-type flip-flop circuit (3) of this embodiment.

FIG. 7 is a circuit diagram for the dynamic-type flip-flop circuit (3) of this embodiment. As a point of difference from the theoretical diagram in FIG. 4, the level fixing circuit comprises the transistor MN6 and a transfer gate circuit including the transistor MP10 that transmits the clock CLK with a delay. The gate of transistor MP10 is connected to ground and the ON resistance of the transistor MP10 is set at a value that is small enough to provide a delay function. Otherwise, the constitution is the same as that in FIG. 4.

Figure 8:
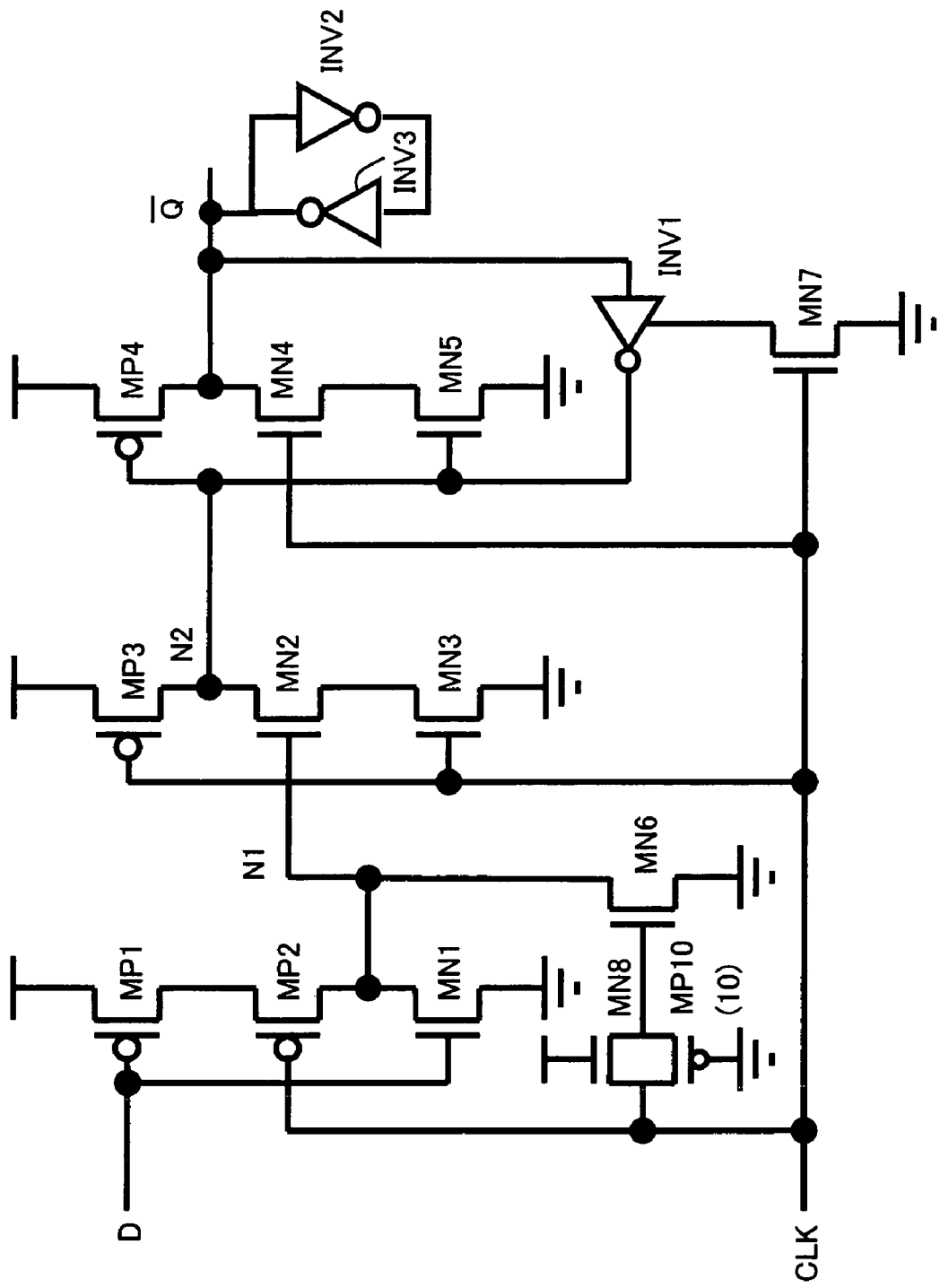
FIG. 8 is a circuit diagram for the dynamic-type flip-flop circuit (4) of this embodiment.

FIG. 8 is a circuit diagram for the dynamic-type flip-flop circuit (4) of this embodiment. As a point of difference from the theoretical diagram in FIG. 4, the level fixing circuit comprises the transistor MN6 and a transfer gate circuit including the transistors MN8 and MP10 that transfer the clock CLK with a delay. The gate of transistor MN8 is connected to the power supply Vdd, while the gate of transistor MP10 is connected to ground. The ON resistance of transistors MN8 and MP10 is set at a value that is small enough to provide a delay function. Because the transfer gate circuit is constituted by a CMOS transistor, either the PMOS or NMOS-side of the transfer gate is always completely on and, therefore, the gate potential of the transistor MN6 can be held at a fixed potential more stably and the gate terminal voltage of transistor MN6 can be afforded the full amplitude. As a result, MN6 can be turned on/off completely. That is, the reason for employing the transfer gate is that, in a case where the transfer gate is an NMOS transfer gate as per FIG. 6, when the clock signal is at the high level, after a fixed delay time, the gate potential of transistor MN6 also assumes the high level. Thereupon, when the high level of the clock signal is afforded the same value as the power supply VDD, the gate potential of transistor MN6 does not rise to the power supply VDD, rising to VDD-VTH instead. (VTH is the threshold value voltage of the transistor MN8). Here, at the exact point where the gate-source voltage of transistor MN8 is VTH, MN8 approaches an off state and, therefore, the gate potential of transistor MN6 is easily affected by noise and the like. Further, in a case where the transfer gate is a PMOS transfer gate as per FIG. 7, conversely, when the clock is at the low level, the gate potential of transistor MN6 must fall to a complete low level (=ground level) and assumes a potential that exceeds ground level by VTH and, as a result, transistor MN6 is not turned completely off. On the other hand, the situation can be improved by employing the CMOS-type transfer gate MN8, MP10 in FIG. 8. Otherwise, the constitution is the same as that in FIG. 4.

Figure 9:
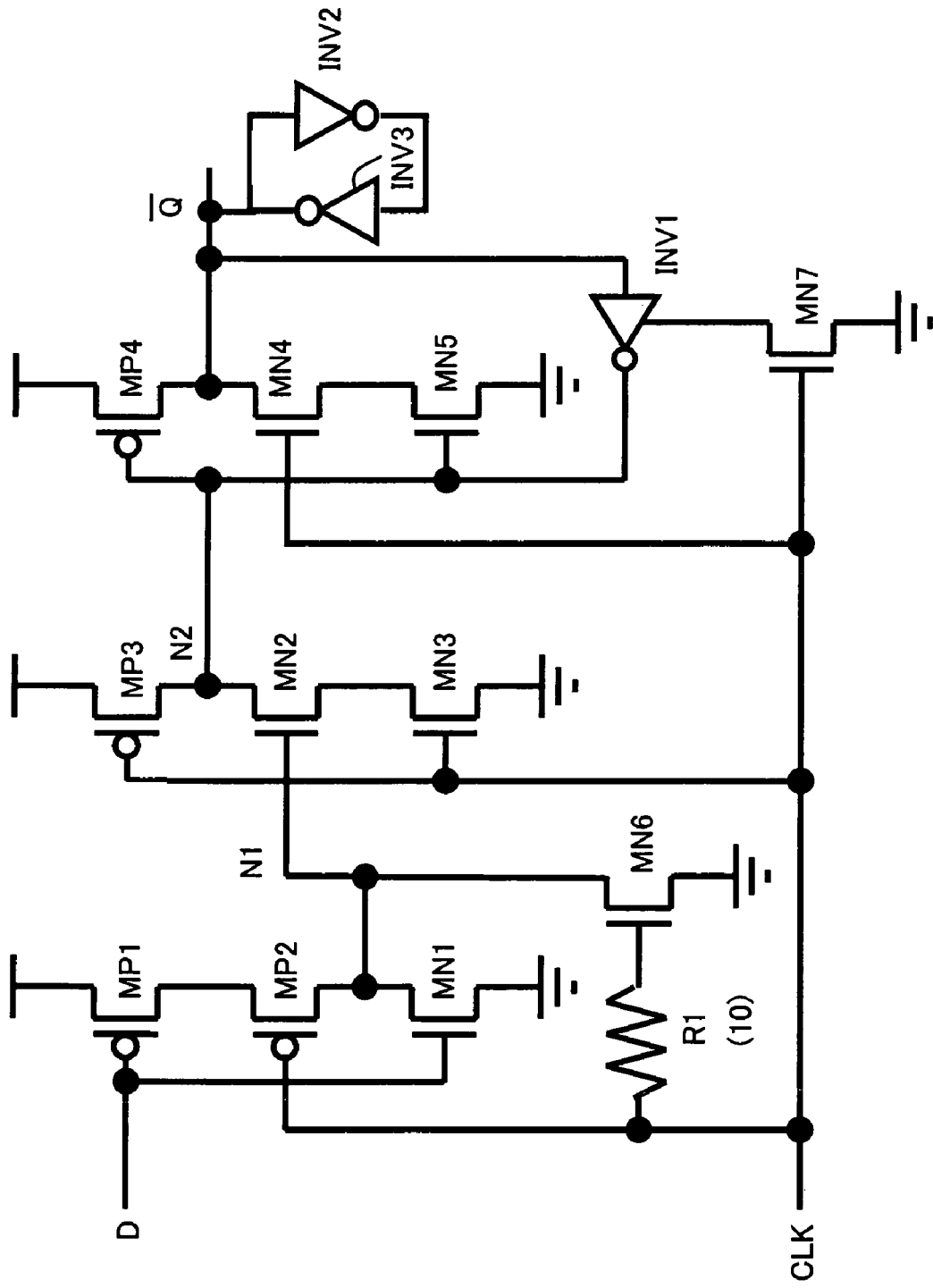
FIG. 9 is a circuit diagram for the dynamic-type flip-flop circuit (5) of this embodiment.

FIG. 9 is a circuit diagram for the dynamic-type flip-flop circuit (5) of this embodiment. As a point of difference from the theoretical diagram in FIG. 4, the level fixing circuit comprises the transistor MN6 and the resistor R1, which transmits the clock CLK with a delay. According to the delay function of the RC circuit arising from the resistor R1 and the gate parasitic capacitance of transistor MN6, the rise in the clock CLK to the high level is transmitted to the gate of the transistor MN6 with the delay. The resistance value of the resistor R1 is set at a value that fulfills the delay characteristic. Otherwise, the constitution is the same as that in FIG. 4.

Figure 10:
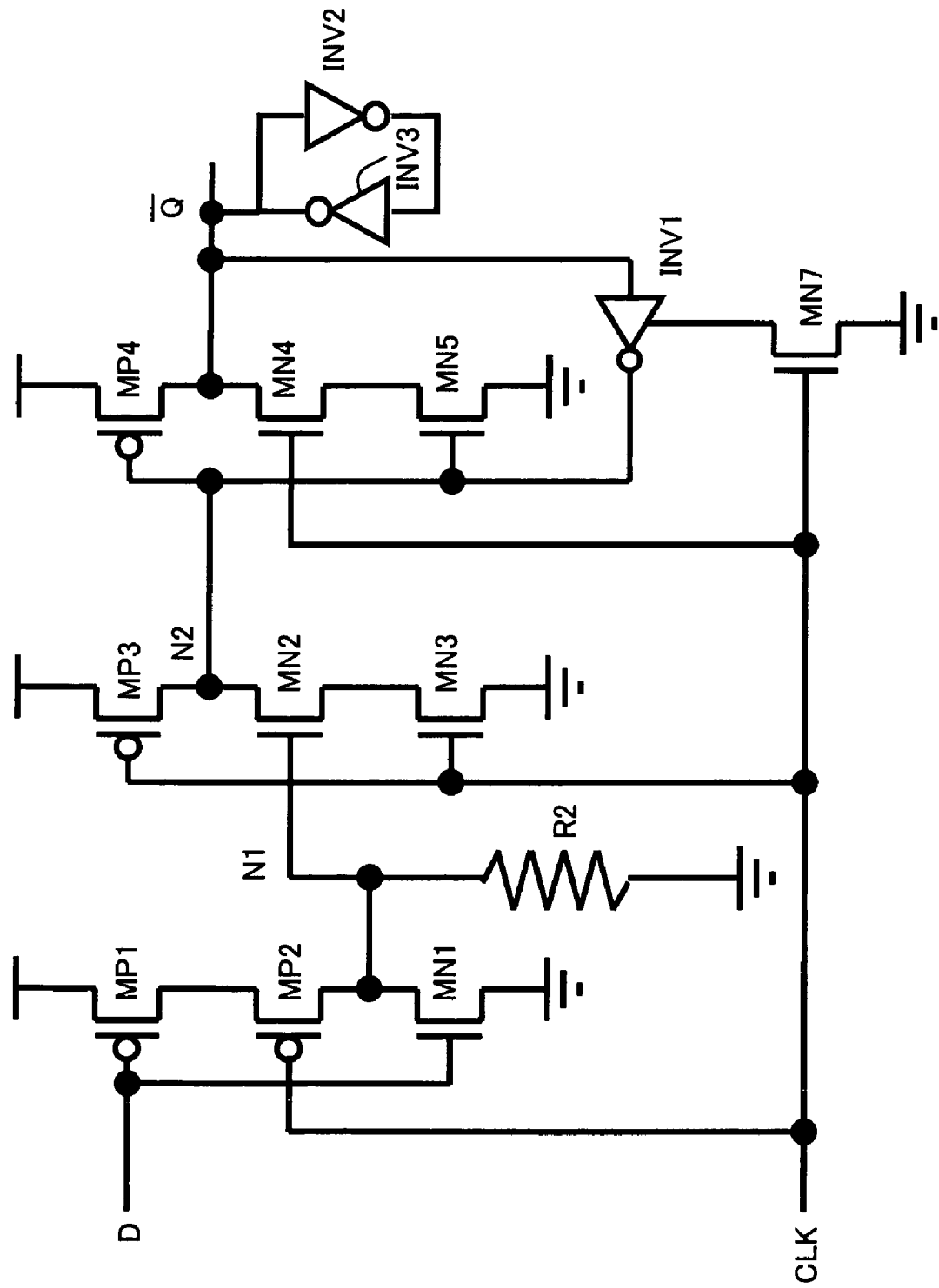
FIG. 10 is a circuit diagram for the dynamic-type flip-flop circuit (6) of this embodiment.

FIG. 10 is a circuit diagram for the dynamic-type flip-flop circuit (6) of this embodiment. As a point of difference from the theoretical diagram of FIG. 4, the level fixing circuit comprises a resistor R2 between node N1 and ground. The resistor R2 constitutes an RC circuit together with the parasitic capacitance of node N1 and the resistance value of resistor R2 is set at a value large enough to reduce node N1 gradually to the low level after the clock CLK has risen to the high level to turn off MP2 and the level of the output terminal /Q has been defined in accordance with the level of node N1. Therefore, during the dynamic operation in response to the high-speed clock CLK, the level fixing function of node N1 afforded by resistor R2 barely operates. In periods during which clock CLK is slow and clock CLK has stopped, node N1 is gradually lowered to and fixed at ground level by means of resistor R2. Otherwise, the constitution is the same as that in FIG. 4.

Figure 11:
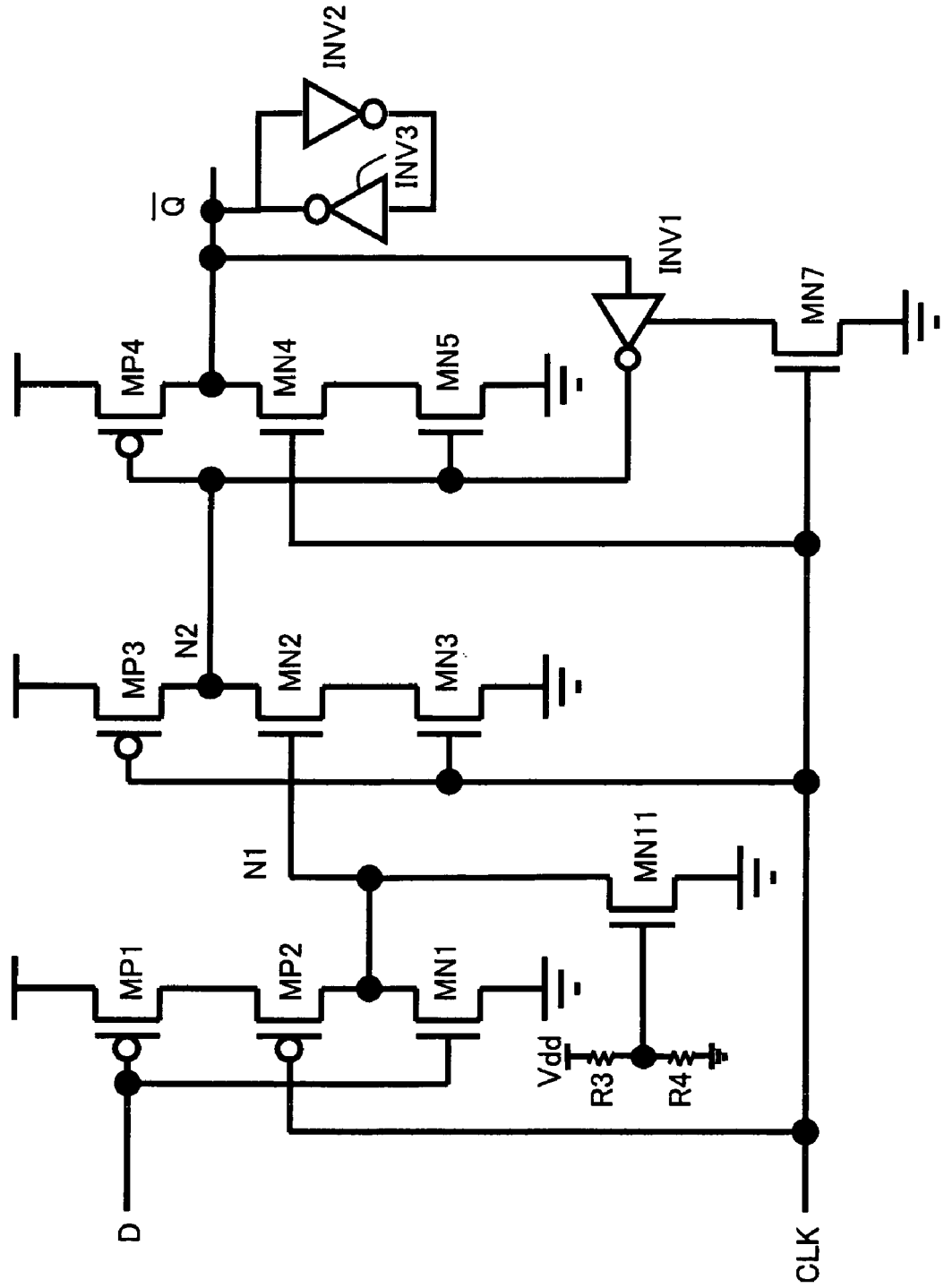
FIG. 11 is a circuit diagram for the dynamic-type flip-flop circuit (7) of this embodiment.

FIG. 11 is a circuit diagram for the dynamic-type flip-flop circuit (7) of this embodiment. This example is a modified example of FIG. 10 and is provided with the transistor MN11 instead of the resistor R2. Further, an intermediate voltage, which is formed at the point of connection between resistors R3 and R4 between the supply voltage Vdd and ground, is applied to the gate of transistor MN11. By adjusting this intermediate voltage, the resistance value of transistor MN11 is increased and an RC circuit similar to that in FIG. 10 can be constituted. Otherwise, the constitution is the same as that in FIG. 4.

Figure 12:
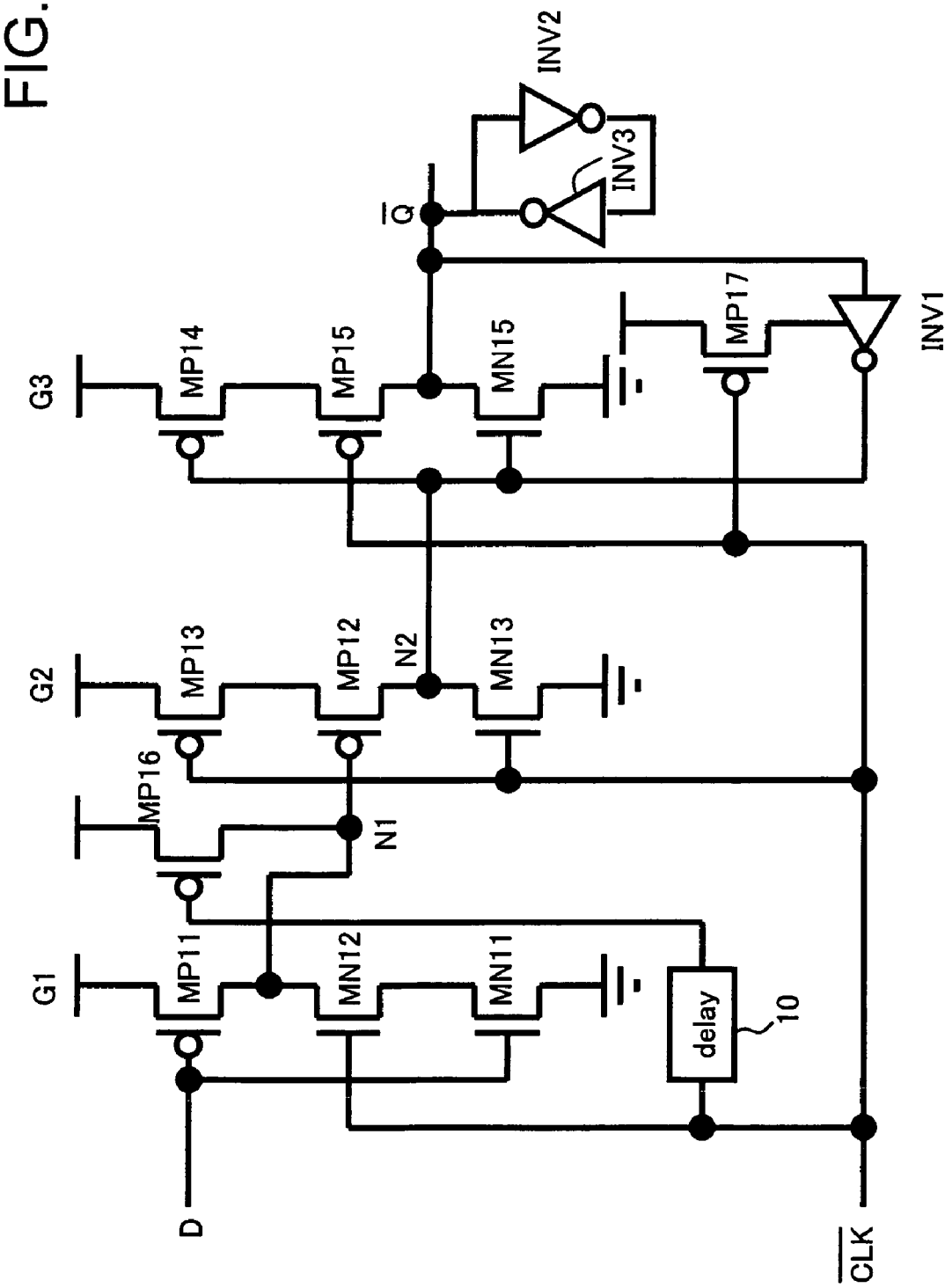
FIG. 12 is a circuit diagram for the dynamic-type flip-flop circuit (8) of this embodiment.

FIG. 12 is a circuit diagram for the dynamic-type flip-flop circuit (8) of this embodiment. In this example, the P- and N-channels of the flip-flop circuit in FIG. 4 are reversed. Further, the inversion clock /CLK is supplied to transistors MN12, MP13, MN13 and MP15. Further, the inverter INV1 of the inversion feedback circuit that is provided between the output terminal /Q and the node N2 is activated by means of the transistor MP17, which is controlled by means of the inversion clock /CLK. In addition, level fixing circuit comprising the delay circuit 10 and transistor MP16 are provided at the node N1.

In this flip-flop circuit, a state where the inversion clock /CLK is at the high level (the clock CLK is at the low level) is the standby state, node N1 assumes the high or low level according to the input data signal D, and node N2 is pre-charged to the low level as a result of transistor MN13 being on. Therefore, when the inversion clock /CLK drops to the low level, transistor MN12 is turned off, transistor MP13 is turned on and node N2 is either changed to the high level or retains the low-level state depending on node N1. In addition, transistor MP15 is turned on and the level of the output terminal /Q is defined according to node N2.

Further, while the inversion clock /CLK is at the low level, transistor MP17 is turned on and the inverter INV1 is activated, whereby fluctuations in the level of node N2 are prevented. Further, transistor MP16 conducts via the delay circuit 10 and node N1 is fixed at the high level, whereby fluctuations in the level of node N1 are prevented. Therefore, the flip-flop circuit in FIG. 12 operates in the same way as the circuit in FIG. 4.

Figure 13:
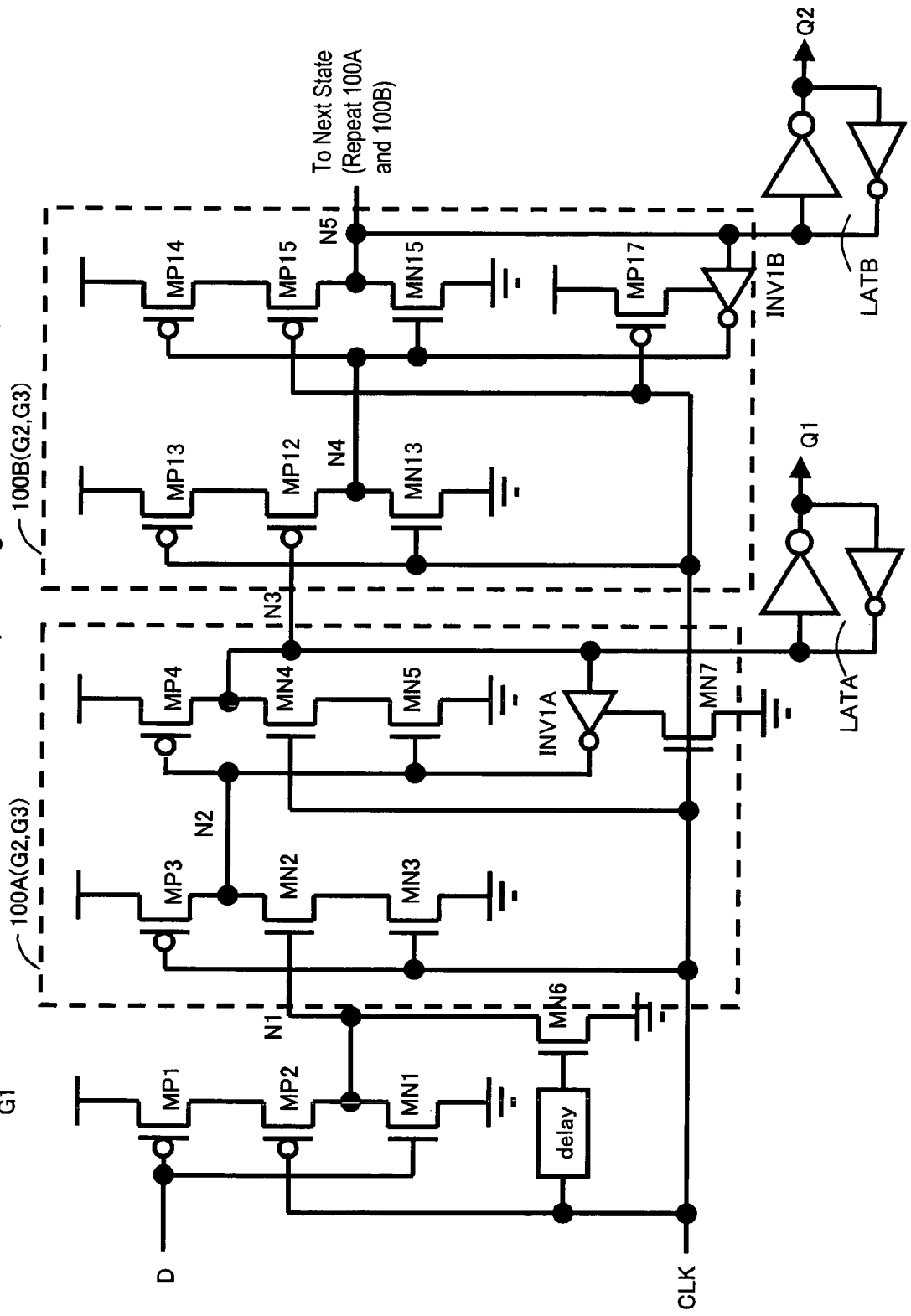
FIG. 13 is a circuit diagram for the dynamic-type flip-flop circuit (9) of this embodiment.

FIG. 13 is a circuit diagram for the dynamic-type flip-flop circuit (9) of this embodiment. This circuit has a two-stage constitution that generates an output Q1 by capturing input data signal D at the rising edge of clock CLK and that generates an output Q2 corresponding with the data signal D at the trailing edge of clock CLK. For this reason, the circuit comprises the initial-stage gate circuit G1 in FIG. 4, a first circuit 100A, which comprises the second- and third-stage gate circuits G2 and G3 respectively in FIG. 4, and a second circuit 100B, which comprises the second-stage and third-stage gate circuits G2 and G3 respectively in FIG. 12.

The operation is as follows. The operation of the circuit comprising the initial-stage gate G1 and first circuit 100A is the same as that in FIG. 4. That is, node N2 is pre-charged to the high level in periods when the clock CLK is at the low level, and when the clock CLK rises to the high level, node N2 either retains the high level or changes to the low level depending on the level of node N1 corresponding with input data signal D. Node N3 is accordingly changed to the high level or low level. The level of node N3 is latched by means of the latch circuit LATA, an inverter INV1A is activated so that node N2 is fixed, and the transistor MN6 conducts so that node N1 is fixed.

While the clock CLK is at the high level, node N4 in the second circuit 100B is pre-charged to the low level. Thereafter, node N4 either retains the low level or changes to the high level depending on the level of node N3 in response to the fall of the clock CLK to the low level and, in accordance with node N4, node N5 is changed to the high level or the low level and latched by means of the latch circuit LATB. Thereafter, the inverter INV1B is activated and node N4 is fixed. Further, while the clock CLK is at the low level, the first circuit 100A is in the standby state.

Therefore, the input data signal D is captured at the rising edge of clock CLK and outputted as the output Q1, and this signal is also transmitted as output Q2 at the trailing edge of clock CLK.

The first circuit 100A and second circuit 100B are repetitively connected to the node N5 of the second circuit 100B. As a result, in response to both edges of the clock, the captured input data signal D can be transferred to a subsequent-stage circuit.

Figure 14:
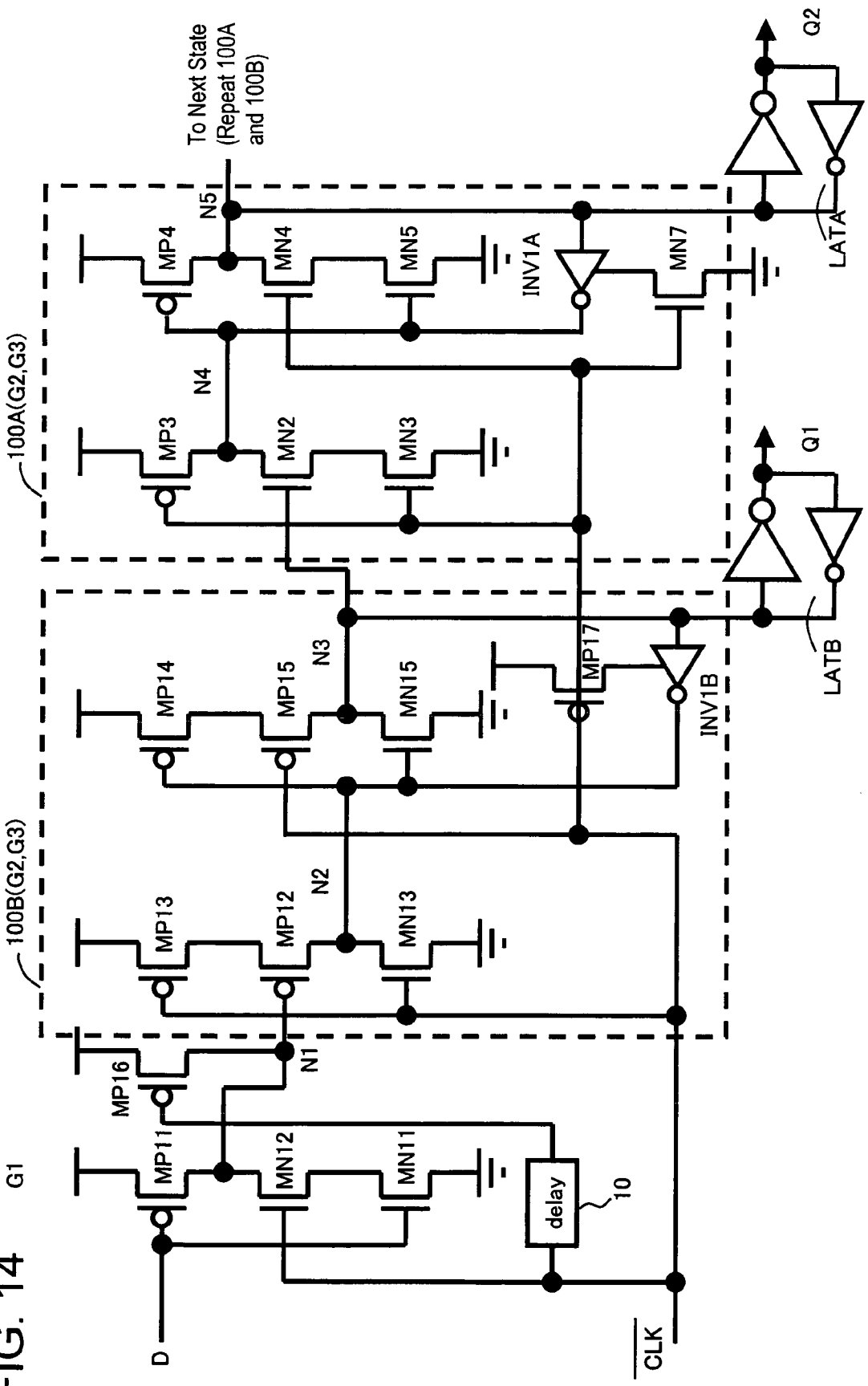
FIG. 14 is a circuit diagram for the dynamic-type flip-flop circuit (10) of this embodiment.

FIG. 14 is a circuit diagram for the dynamic-type flip-flop circuit (10) of this embodiment. This circuit is an example in which the P and N channels in FIG. 13 are reversed and the first and second circuits 100A and 100B respectively are reversed. That is, the flip-flop circuit of a multiple-stage constitution in FIG. 14 comprises a two-stage constitution comprising the initial-stage gate circuit G1 in FIG. 12, the second-stage circuit 100B comprising the second-stage and third-stage gate circuits G2 and G3 respectively in FIG. 12, and the first circuit 100A comprising the second-stage and third-stage gate circuits G2 and G3 respectively in FIG. 4. Further, the flip-flop circuit generates the output Q1 by capturing input data signal D at the trailing edge of the inversion clock /CLK and generates the output Q2 corresponding with the data signal D at the rising edge of the inversion clock /CLK. This operation is similar to that in FIG. 13.

Figure 15:
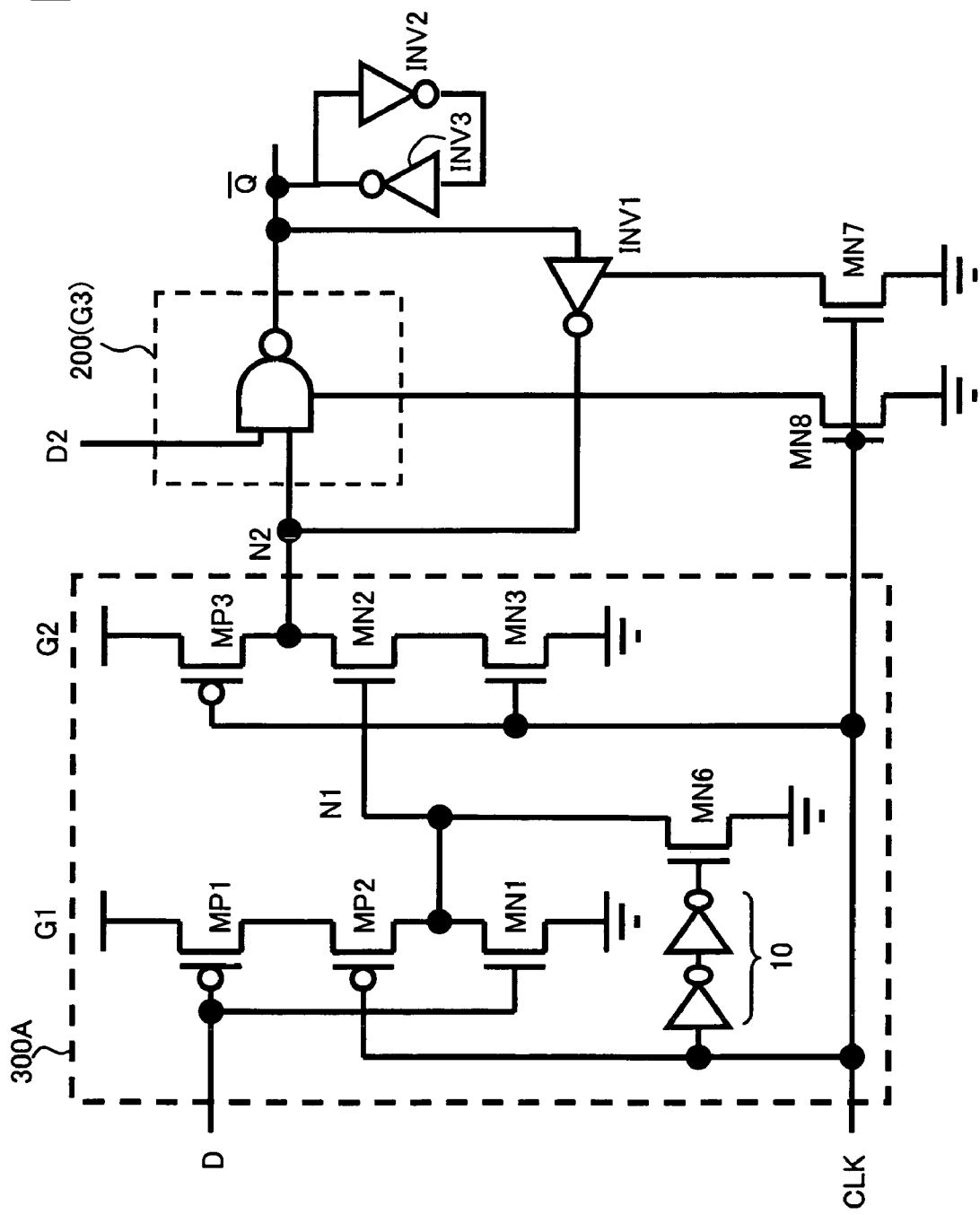
FIG. 15 is a circuit diagram for the dynamic-type flip-flop circuit (11) of this embodiment.

FIG. 15 is a circuit diagram for the dynamic-type flip-flop circuit (11) of this embodiment. This flip-flop circuit is a modified example of the flip-flop circuit in FIG. 5. The initial-stage and second-stage gate circuits G1 and G2 respectively are the same as those in FIG. 5. However, the third-stage gate circuit is constituted by a NAND gate 200, to which a data signal D2 is inputted, in addition to the node N2. This NAND gate 200 is an example of a combination circuit to which node N2 is inputted and may also be called a logic circuit that transfers the signal at node N2 in accordance with data signal D2. Further, the NAND gate 200 is activated by means of transistor MN8, which conducts in periods during which the clock CLK is at the high level. The remaining inversion feedback circuit INV1 between output terminal /Q and node N2, the transistor MN6, which fixes the level of node N1, and the delay circuit 10, and so forth, are the same as those in circuit in FIG. 5. Therefore, the third-stage gate circuit may constitute part of the combination circuit.

In the flip-flop circuit, the third-stage gate circuit G3 generates the output signal /Q by inverting the level of node N2 by means of NAND gate 200 when the data signal D2 is at the high level. Further, the level of node N2 is fixed by inverting the output signal /Q by means of the activated inversion feedback circuit INV1. On the other hand, when the data signal D2 is at the low level, the third-stage gate circuit G3 fixes the output signal /Q at the high level regardless of whether node N2 is at the high level or at the low level. The output signal /Q then does not change even when node N2 is inverted via the inversion feedback circuit INV1. Therefore, only when data signal D2 is at the high level, an operation is similar to that in FIG. 5 is performed and, when data signal D2 is at the low level, the output signal /Q is driven to the high level irrespective of node N2.

Figure 16:
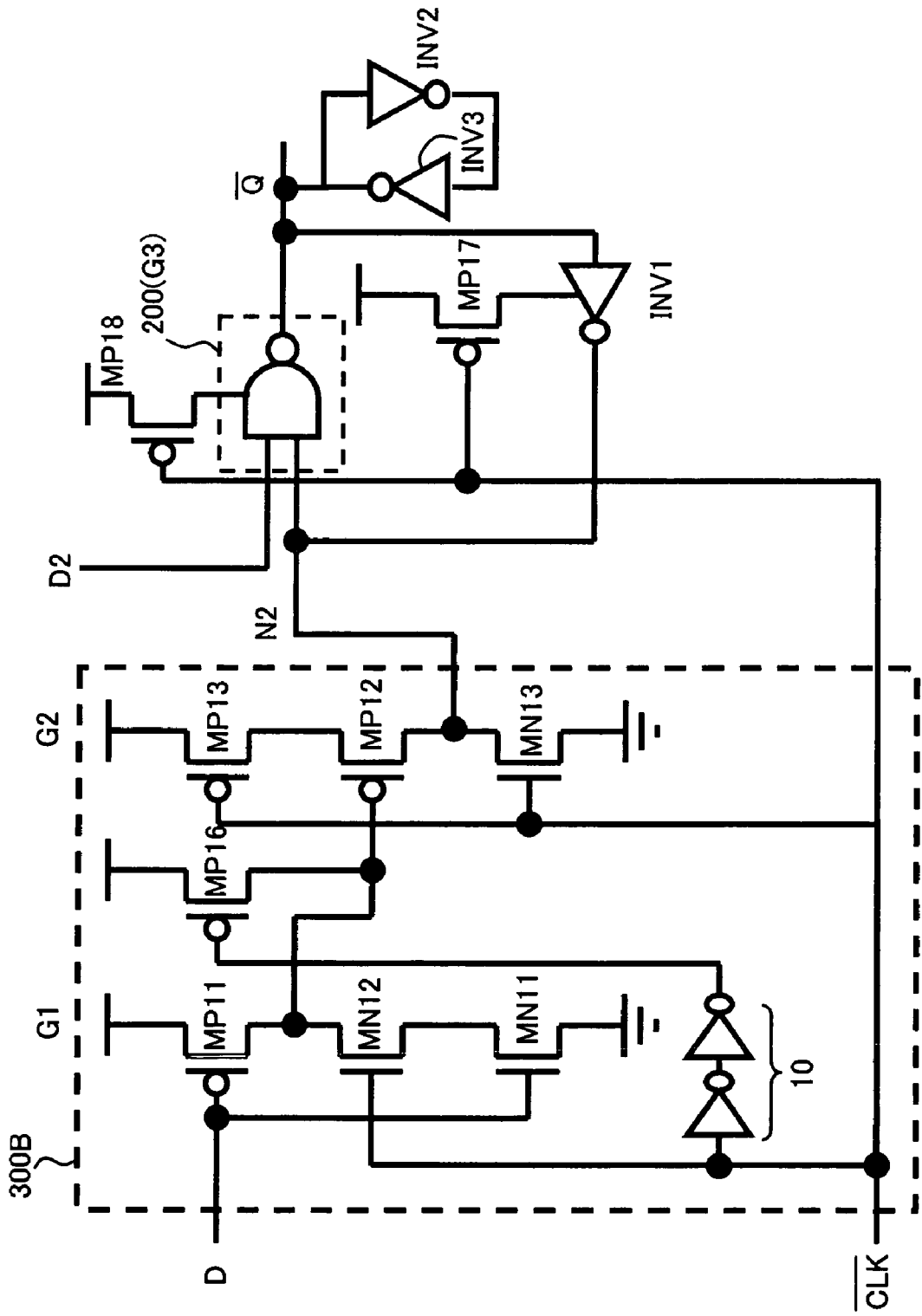
FIG. 16 is a circuit diagram to the dynamic-type flip-flop circuit (12) of this embodiment.

FIG. 16 is a circuit diagram for the dynamic-type flip-flop circuit (12) of this embodiment. This flip-flop circuit is an example in which the circuit in FIG. 15 and the P and N channels are reversed. That is, this flip-flop circuit is a modified example of the flip-flop circuit in FIG. 12. The initial-stage and second-stage gate circuits G1 and G2 are the same as those in FIG. 12. However, the third-stage gate circuit is constituted by the NAND gate 200 to which the data signal D2 is inputted, in addition to the node N2. This NAND gate 200 is an example of a sequencer circuit in which node N2 is inputted and is a logic circuit in which the signal of node N2 is inverted in accordance with the data signal D2. Further, the NAND gate 200 is activated by means of the transistor MP18 that conducts in periods during which the inversion clock /CLK is at the low level. The remaining inversion feedback circuit INV1 between the output terminal /Q and node N2, transistor MP16 that fixes the level of node N1, and the delay circuit 10, and so forth, are the same as those in the circuit of FIG. 12.

MODIFIED EXAMPLE

Figure 17:
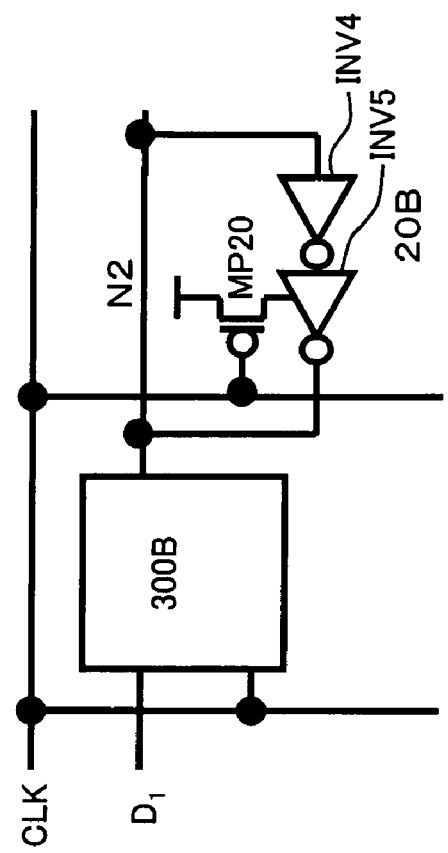
FIG. 17 is a circuit diagram for the dynamic-type flip-flop circuit (13) of this embodiment.

FIG. 17 is a circuit diagram for the dynamic-type flip-flop circuit (13) of this embodiment. This flip-flop circuit is constituted by a circuit 300A, which comprises the initial-stage gate circuit G1 and second-stage gate circuit G2 shown in FIG. 15 and a latch circuit 20A, which comprises two inverters INV4 and INV5 that latch and hold node N2 of the circuit 300A only when the clock CLK is at the high level. Further, one inverter INV5 of the latch circuit 20A is activated by means of a transistor MN20 that conducts only while the clock CLK is at the high level.

That is, the third-stage gate circuit G3 in the flip-flop circuit shown in FIG. 4 is omitted from the flip-flop circuit in FIG. 17, which instead comprises a latch circuit 20A, which is activated to hold node N2 only when the clock CLK is at the high level. As a result of this modification, the flip-flop circuit in FIG. 4 and the flip-flop circuit in FIG. 17 differ with respect to the following points. In the case of the flip-flop circuit in FIG. 4, a standby state exists when the clock CLK is at the low level and, when the clock CLK rises to the high level, the input data signal D is captured and the corresponding signal is outputted to node N2 and output terminal /Q. Even when the clock CLK drops to the low level once again, the data of the output terminal /Q is held by means of the latch circuit as valid data. On the other hand, in the case of the flip-flop circuit in FIG. 17, the standby state is established while the clock CLK is at the low level, and, when the clock CLK rises to the high level, the input data signal D is captured and the corresponding signal is outputted to the node N2. Because the latch circuit 20A is activated in periods during which the clock CLK is at the high level, the data of node N2 is held even when a leak current is produced. However, because there is no a third-stage gate circuit, when the clock CLK assumes the low level, the latch circuit 20A is deactivated and node N2 is pre-charged to the high level, and hence, there is no longer any valid output data. That is, the flip-flop circuit in FIG. 17 has a limiting function that outputs valid data only in periods during which the clock CLK is at the high level.

In this circuit, node N2, which is in a floating state while clock CLK=H, is held by means of the latch circuit 20A in periods during which the clock CLK=H and, therefore, the level of node N2 does not fluctuate as a result of a leak current. Further, fluctuations in the level may be prevented as per node N1 that is in a floating state.

Figure 18:
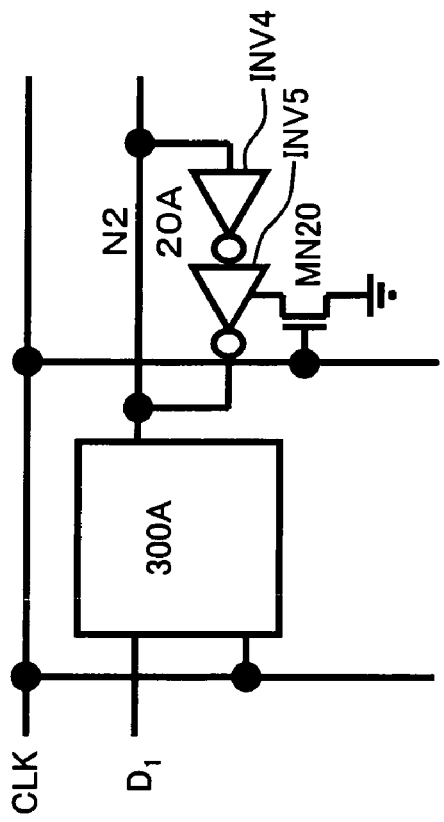
FIG. 18 is a circuit diagram for the dynamic-type flip-flop circuit (14) of this embodiment.

FIG. 18 is a circuit diagram for the dynamic-type flip-flop circuit (14) of this embodiment. The flip-flop circuit in FIG. 18 has, instead of circuit 300A of FIG. 17, circuit 300B that comprises the initial-stage gate circuit G1 and second-stage gate circuit G2 of FIG. 16, and a latch circuit 20B instead of the latch circuit 20A. That is, the latch circuit 20B is activated and latches and holds the data of node N2 as a result of the conduction of transistor MP20 only in periods during which the clock CLK is at the low level.

The flip-flop circuit in FIG. 18 is reverse-phased relative to the operation in FIG. 17 and is in a standby state while clock CLK is at the high level but captures the input data signal D when the clock CLK falls to the low level and outputs and latches a signal corresponding with the node N2. However, when the clock CLK assumes the high level, latch circuit 20B is deactivated and node N2 is pre-charged to the low level. That is, the flip-flop circuit in FIG. 18 possesses a limiting function such that valid data is outputted only in periods during which the clock CLK is at the low level.

Figure 19:
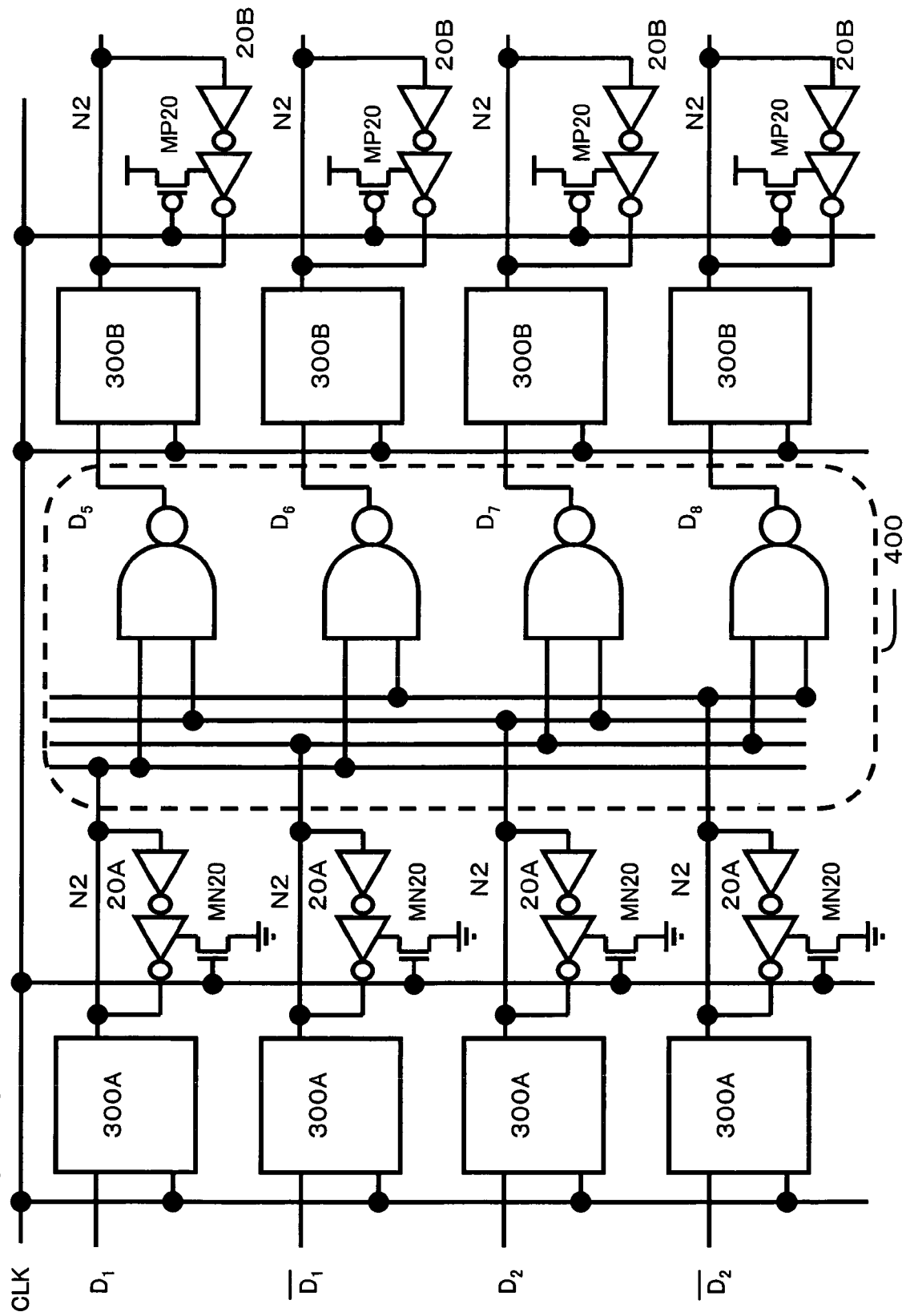
FIG. 19 is a circuit diagram for the dynamic-type flip-flop circuit (15) of this embodiment.

FIG. 19 shows an example of a circuit in which a predetermined sequencer circuit is provided between the flip-flop circuits in FIGS. 17 and 18. This sequencer circuit 400 is a two-bit decoder circuit comprising four NAND gates. That is, in the circuit in FIG. 19, uninverted signals D1 and D2 and inverted signals /D1, /D of two-bit data D1 and D2 are captured by a means of the flip-flop circuit in FIG. 17 (a circuit comprising 300A and 20A) in response to clock CLK=H and holds these signals as valid data only in periods during which clock CLK=H. Further, data, which is held as valid data in periods during which the clock CLK=H, is decoded by the sequencer circuit 400 comprising the decoder circuit and the subsequent-stage flip-flop circuit in FIG. 18 (a circuit comprising 300B and 20B) captures and holds the signals as valid data in response to the clock CLK=L. Therefore, the circuit in FIG. 19 is an example of a circuit in which a flip-flop circuit, sequencer circuit (logic circuit), and a flip-flop circuit are connected in sequence. Data is transferred to a subsequent stage at each half cycle of the clock CLK and the desired logic operation is performed by means of the sequencer circuit.

As detailed hereinabove, by using the flip-flop circuits in FIGS. 17 and 18, it is possible to constitute a circuit that captures data at each half cycle of the clock CLK, performs a desired logic operation, and transfers the processed data to a subsequent stage. Moreover, the occurrence of level fluctuations as a result of leak currents can be prevented in the event of a low-speed clock.

What is claimed is:

1. A flip-flop circuit that captures an input signal in sync with a clock, comprising:
    a first gate that outputs a first signal corresponding with the input signal;
    a second gate that generates a second signal of a first predetermined level in response to a first level of the clock and causes the second signal to be a level corresponding with the first signal in response to a second level of the clock;
    a third gate that outputs a third signal corresponding with the second signal in response to the second level of the clock;

a first inversion feedback circuit, provided between a terminal of the third signal and a terminal of the second signal, that is activated in response to the second level of the clock and latches the third signal together with the third gate; and level fixing circuit that fixes the terminal of the first signal at a second predetermined level with a predetermined time delay after the clock changes to the second level.

2. A flip-flop circuit, including a first power supply and a second power supply of a potential that is different from that of the first power supply, for capturing an input signal in sync with a clock, comprising:

a first gate, including transistors connected in three stages between the first and second power supplies, that outputs a first signal corresponding with the input signal;

a second gate, including transistors connected in three stages between the first and second power supplies, that generates a second signal of a first predetermined level in response to a first level of the clock and causes the second signal to be a level corresponding with the first signal in response to a second level of the clock;

a third gate, including transistors connected in three stages between the first and second power supplies, that outputs a third signal corresponding with the second signal in response to the second level of the clock;

a first inversion feedback circuit, provided between a terminal of the third signal and a terminal of the second signal, that is activated in response to the second level of the clock; and level fixing circuit that fixes the terminal of the first signal at a second predetermined level with a predetermined time delay after the clock changes to the second level.

3. The flip-flop circuit according to claim 1 or 2, wherein the inversion feedback circuit comprises an activation transistor that conducts in response to the second level of the clock and an inverter that is activated when the activation transistor conducts.

4. The flip-flop circuit according to claim 2, wherein the level fixing circuit comprises:

a level fixing transistor provided between a terminal of the first signal and the first or second power supply; and a delay circuit that causes the level fixing transistor to conduct by supplying the second level of the clock to the gate of the level fixing transistor such that the second level of the clock is delayed.

5. The flip-flop circuit according to claim 4, wherein the delay circuit is either inverters of an even number of stages, a transfer transistor the gate of which is fixed at a predetermined potential or a resistive element.

6. The flip-flop circuit according to claim 2, wherein the level fixing circuit comprises resistance element that are provided between a terminal of the first signal and the first or second power supply and the resistance element possess a delay characteristic to the extent of changing the level of the first signal to the second predetermined level after the third signal has been defined by means of the first signal.

7. The flip-flop circuit according to claim 1 or 2, wherein a latch circuit is connected to the terminal of the third signal.

8. The flip-flop circuit according to claim 2, wherein the first gate comprises, between the first and second power supplies, a first transistor of a first conductivity type (MN1, MP11) to the gate of which the input signal is supplied, a first transistor of a second conductivity type (MP2, MN12) to the gate of which the clock is supplied, and a second transistor of the second conductivity type (MP1, MN11) to the gate of which the input signal is supplied;

the second gate comprises, between the first and second power supplies, a third transistor of the first conductivity type (MN3, MP13) to the gate of which the clock is supplied, a second transistor of the first conductivity type (MN2, MP12) to the gate of which the first signal is supplied, and a third transistor of the second conductivity type (MP3, MN13) to the gate of which the clock is supplied; and the third gate comprises, between the first and second power supplies, a fifth transistor of the first conductivity type (MN5, MP14) to the gate of which the second signal is supplied, a fourth transistor of the first conductivity type (MN4, MP15) to the gate of which the clock is supplied; and a fourth transistor of the second conductivity type (MP4, MN15) to the gate of which the second signal is supplied.

9. The flip-flop circuit according to claim 2, further comprising:

a fourth gate including transistors, connected in three stages between the first and second power supplies, that generates a fourth signal of a third predetermined level in response to the second level of the clock and causes the fourth signal to be a level corresponding with the third signal in response to the first level of the clock;

a fifth gate, including transistors connected in three stages between the first and second power supplies, that outputs a fifth signal corresponding with the fourth signal in response to the first level of the clock; and a second inversion feedback circuit, provided between a terminal of the fifth signal and a terminal of the fourth signal, that is activated in response to the first level of the clock.

10. The flip-flop circuit according to claim 9, wherein the second gate, the third gate and first inversion feedback circuit, and the fourth gate, the fifth gate and second inversion feedback circuit are connected repetitively downstream of the fifth gate.

11. A flip-flop circuit, including a first power supply and a second power supply of a potential that is different from that of the first power supply, that captures an input signal in sync with a clock, comprising:

a first gate, including transistors connected in three stages between the first and second power supplies, that outputs a first signal corresponding with the input signal;

a second gate, including transistors connected in three stages between the first and second power supplies, that generates a second signal of a first predetermined level in response to a first level of the clock and causes the second signal to be a level corresponding with the first signal in response to a second level of the clock;

a combination circuit that is activated in response to the second level of the clock and outputs a third signal corresponding with the second signal;

a first inversion feedback circuit, provided between a terminal of the third signal and a terminal of the second signal, that is activated in response to the second level of the clock; and level fixing circuit that fixes a terminal of the first signal at a second predetermined level with a predetermined time delay after the clock changes to the second level.

12. The flip-flop circuit according to claim 11, wherein the combination circuit comprises a logic circuit to which the second signal and another signal are inputted and which generates a logical output for the input in sync with the clock.

13. The flip-flop circuit according to claim 1, 2, or 11, wherein the clock has a frequency band from a first frequency to a second frequency that is lower than the first frequency.

* * * * *